United States Patent [19]
Kawashima et al.

[11] Patent Number: 6,084,309
[45] Date of Patent: Jul. 4, 2000

[54] SEMICONDUCTOR DEVICE AND SEMICONDUCTOR DEVICE MOUNTING STRUCTURE

[75] Inventors: Toyoshige Kawashima; Mitsutaka Sato; Tetsuya Fujisawa, all of Kawasaki, Japan

[73] Assignee: Fujitsu Limited, Kawasaki, Japan

[21] Appl. No.: 08/889,107

[22] Filed: Jul. 7, 1997

Related U.S. Application Data

[60] Continuation-in-part of application No. 08/547,616, Oct. 24, 1995, Pat. No. 5,773,313, which is a division of application No. 08/136,462, Oct. 15, 1993, Pat. No. 5,519,251.

[30] Foreign Application Priority Data

Oct. 20, 1992 [JP] Japan .................................. 4-281951
Feb. 27, 1997 [JP] Japan .................................. 9-044227

[51] Int. Cl.⁷ .................................................. H01L 23/48
[52] U.S. Cl. .......................... 257/778; 257/666; 257/779; 257/787
[58] Field of Search ................................. 257/778, 779, 257/666, 787, 678

[56] References Cited

U.S. PATENT DOCUMENTS

| | | | |
|---|---|---|---|
| 4,280,132 | 7/1981 | Hayakawa et al. | 437/220 |
| 4,697,204 | 9/1987 | Mita et al. | 257/779 |
| 5,107,325 | 4/1992 | Nakayoshi | 257/692 |
| 5,134,773 | 8/1992 | LeMarie et al. | 437/217 |
| 5,172,214 | 12/1992 | Casto | 437/220 |
| 5,304,843 | 4/1994 | Takubo et al. | 437/217 |
| 5,363,279 | 11/1994 | Cha | 257/692 |
| 5,444,293 | 8/1995 | Li | 257/779 |

FOREIGN PATENT DOCUMENTS

| | | |
|---|---|---|
| 52-030184 | 7/1977 | Japan . |
| 60-257159 | 12/1985 | Japan . |
| 63-015451 | 1/1988 | Japan . |
| 63-015453 | 1/1988 | Japan . |
| 63-190363 | 8/1988 | Japan . |
| 3-094438 | 4/1991 | Japan . |
| 3-157959 | 7/1991 | Japan . |
| 3-280554 | 12/1991 | Japan . |
| 4-044347 | 2/1992 | Japan . |
| 4-44347 | 2/1992 | Japan . |
| 6-97349 | 4/1994 | Japan . |

*Primary Examiner*—Carl Whitehead, Jr.
*Assistant Examiner*—Roy Potter
*Attorney, Agent, or Firm*—Staas & Halsey LLP

[57] ABSTRACT

A semiconductor device includes a semiconductor chip, a package encapsulating the semiconductor chip, a plurality of leads each having one end electrically connected to the semiconductor chip and another end exposed at a wall surface of the package to form an external terminal, where each of the leads excluding the external terminal is encapsulated within the package, and a lead projection provided on the external terminal of the lead. This lead projection projects from the wall surface of the package, so that a thickness of a soft bonding material provided on the external terminal can be increased to provide an improved bonding and connection when mounting the semiconductor device on a circuit substrate.

19 Claims, 39 Drawing Sheets

FIG. 38
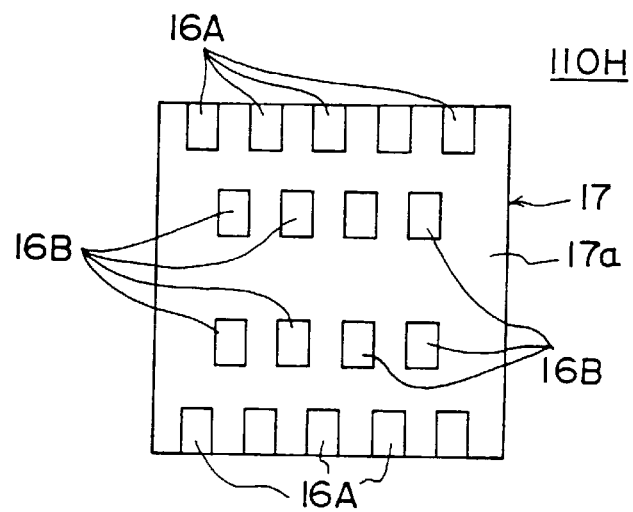
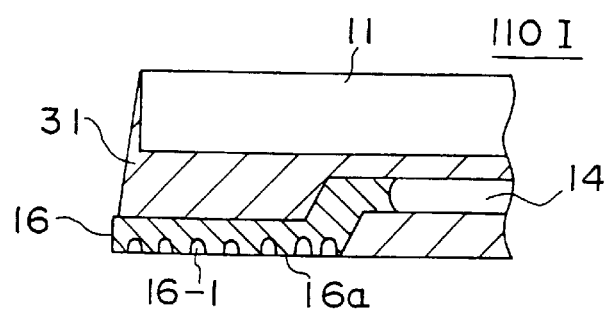
FIG. 39A
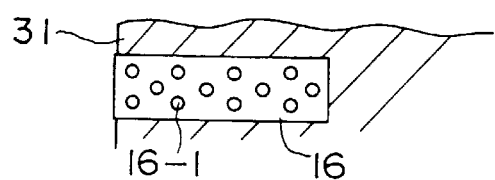
FIG. 39B

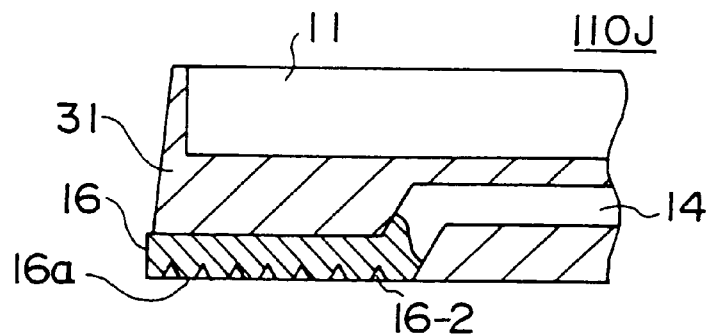
FIG. 40A
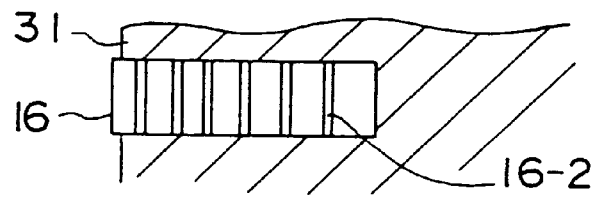
FIG. 40B
FIG. 41
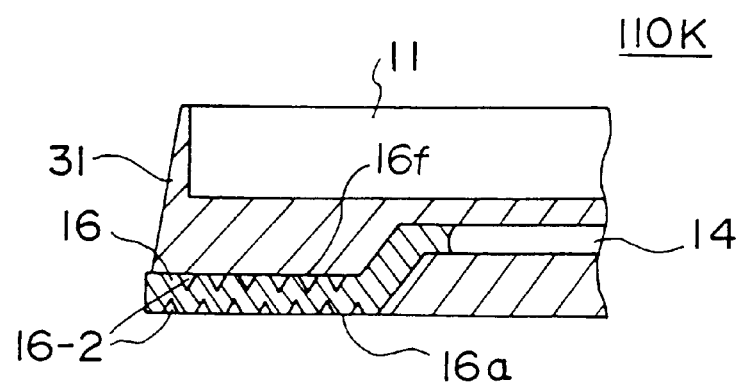

SEMICONDUCTOR DEVICE AND SEMICONDUCTOR DEVICE MOUNTING STRUCTURE

This application is a Continuation-In-Part Application of a U.S. patent application Ser. No. 547,616 filed Oct. 24, 1995, U.S. Pat. No. 5,773,313 which is a Divisional Application of a U.S. patent application Ser. No. 136,462 filed Oct. 15, 1993 which has issued as a U.S. Pat. No. 5,519,251 on May 21, 1996.

BACKGROUND OF THE INVENTION

1. Field of the Invention

The present invention generally relates to semiconductor devices, methods of producing semiconductor devices and semiconductor device mounting structures, and more particularly to a semiconductor device which has only a portion of leads exposed at a bottom surface of a package so as to improve the packaging density of the semiconductor device, a method of producing such a semiconductor device, and a semiconductor device mounting structure for mounting such a semiconductor device.

2. Description of the Related Art

Due to the recent improvements in reducing the size, increasing the operation speed and increasing the functions of electronic equipments, there are demands to realize similar improvements in semiconductor devices. In addition to these demands on the semiconductor devices per se, there are also demands to improve the packaging density of the semiconductor device when packaging the semiconductor device on a substrate.

Accordingly, although the majority of the existing semiconductor devices employ the surface mounting which connects the leads at the surface of the substrate, there are demands to further improve the packaging density of the semiconductor devices.

FIG. 1 shows a perspective view of an example of a conventional semiconductor device 1. FIG. 2 is a cross sectional view of this semiconductor device 1 taken along a line X—X in FIG. 1. For example, this type of semiconductor device was proposed in Japanese Laid-Open Patent Applications No.63-15453 and No.63-15451.

In FIGS. 1 and 2, the semiconductor device 1 generally includes a semiconductor chip 2, a resin package 3 which encapsulates the semiconductor chip 2, a plurality of leads 4, and a stage 7 on which the semiconductor chip 2 is mounted. One end 4a of the lead 4 is connected to the semiconductor chip 2 via a wire 5, and the other end of the lead 4 is exposed at a bottom surface 3a of the package 3 to form an external terminal 6. In other words, all parts of the semiconductor device 1 excluding the external terminals 6 of the leads 4 are encapsulated within the package 3.

Because the external terminals 6 of the leads 4 are exposed at the bottom surface 3a of the package 3 in this semiconductor device 1, the projecting length of the leads 4 on the outer side of the package 3 can be made small, thereby making it possible to improve the packaging density. In addition, the external terminals 6 of the leads 4 do not need to be bent as in the case of the conventional leads having the L-shape or gull-wing shape. As a result, no mold is required to bend the external terminals 6, thereby making it possible to simplify the production process and to reduce the production cost.

On the other hand, another type of semiconductor device was proposed in a Japanese Laid-Open Patent Application No.4-44347. According to this proposed semiconductor device, the leads are fixed to a circuit forming surface of the semiconductor chip via an insulative adhesive agent. In addition, the size of the package is reduced by encapsulating only the circuit forming surface or only the circuit forming surface and side surfaces of the semiconductor chip.

However, according to the semiconductor device 1 described above, the end 4a of the lead 4 is located on both sides of the semiconductor chip 2. As a result, there is a limit to reducing the size of the package 3, and there was a problem in that the size of the semiconductor device 1 cannot be reduced to a sufficient extent. In other words, the size of the semiconductor device ideally is approximately the same as the size of the semiconductor chip. However, the size of the semiconductor device 1 is approximately two or more times greater than the size of the semiconductor chip 2.

In addition, the semiconductor device 1 does not take the heat radiation into any consideration. That is, there was a problem in that the semiconductor device 1 cannot efficiently radiate the heat generated from the semiconductor chip 2 outside the package 3.

On the other hand, according to the semiconductor device proposed in the Japanese Laid-Open Patent Application No.4-44347, the leads which are connected to an external substrate are apart from the package, and thus, the transfer mold technique cannot be employed as the package forming technique, and the troublesome potting technique must be employed. As a result, this proposed semiconductor device requires troublesome processes to produce, and there were problems in that the production efficiency of the semiconductor device is poor and the production cost of the semiconductor device is high. It is theoretically possible to produce this semiconductor device by employing the transfer mold technique, however, this would require the mold to be made up of a large number of split molds, and this technique is impractical in that the mold would become extremely expensive.

SUMMARY OF THE INVENTION

Accordingly, it is a general object of the present invention to provide a novel and useful semiconductor device and a method of producing the same, in which the problems described above are eliminated.

A first particular object of the present invention is to provide a semiconductor device and a method of producing the same, which can sufficiently reduce the size of the semiconductor device.

Another and more specific object of the present invention is to provide a semiconductor device comprising a semiconductor chip having a top surface and a bottom surface, a plurality of leads arranged under the bottom surface of the semiconductor chip, where the leads have first ends electrically coupled to the semiconductor chip and second ends which form external terminals and each of the external terminals have a bottom surface, and a package encapsulating the semiconductor chip and the leads so that the bottom surface of each of the external terminals is exposed at a bottom surface of the package and remaining portions of the leads are embedded within the package, where the package has a size which is approximately the same as that of the semiconductor chip in a plan view viewed from above the top surface of the semiconductor chip. According to the semiconductor device of the present invention, it is possible to considerably reduce the size of the semiconductor device to approximately the same size as the semiconductor chip in the plan view.

Still another object of the present invention is to provide a method of producing a semiconductor device comprising the steps of (a) press-working a lead frame and forming a plurality of leads which extend inwards to a predetermined position where a semiconductor chip is to be mounted, (b) mounting the semiconductor chip at the predetermined position on a stage, where the steps (a) and (b) are carried out in an arbitrary order, (c) wire-bonding first ends of the leads to the semiconductor chip via wires, and (d) encapsulating the semiconductor chip and the leads by a resin package so that a bottom surface of the leads is exposed at second end at a bottom surface of the resin package. According to the method of producing the semiconductor device of the present invention, it is possible to produce the semiconductor device which is considerably small compared to the conventional semiconductor device using simple processes. In addition, since the leads are embedded within the resin package and the second ends (external terminals) of the leads are exposed at the bottom surface of the resin package, it is possible to employ the transfer mold technique as the package forming technique. As a result, it is possible to form the resin package with ease and improve the production yield and also reduce the production cost.

A second particular object of the present invention is to provide a semiconductor device and a semiconductor device mounting structure, which can relieve a stress which is generated due to a difference between coefficients of linear thermal expansion of the semiconductor device and a circuit substrate, so as to improve the mounting characteristic and reliability of the semiconductor device when mounting the semiconductor device on the circuit substrate.

A further object of the present invention is to provide a semiconductor device comprising a semiconductor chip, a package encapsulating the semiconductor chip, the package having a wall surface, a plurality of leads each having one end electrically connected to the semiconductor chip and another end exposed at the wall surface of the package to form an external terminal, each of the leads excluding the external terminal being encapsulated within the package, and a lead projection provided on the external terminal of the lead, the lead projection projecting from the wall surface of the package. According to the semiconductor device of the present invention, it is possible to increase a thickness of a soft bonding material which is arranged on the external terminal when mounting the semiconductor device on a circuit substrate, as compared to the conventional semiconductor device having no lead projection, and a stress when generated can be satisfactorily absorbed by the soft bonding material having the increased thickness, thereby preventing a crack from being formed in the package.

Another object of the present invention is to provide a semiconductor device comprising a semiconductor chip, a package encapsulating the semiconductor chip, the package having a wall surface, a plurality of leads each having one end electrically connected to the semiconductor chip and another end exposed at the wall surface of the package to form an external terminal, each of the leads excluding the external terminal being encapsulated within the package, and a package projection provided on the wall surface of the package where the external terminal of the lead is exposed, the package projection projecting with respect to the external terminal. According to the semiconductor device of the present invention, it is possible to increase a thickness of a soft bonding material which is arranged on the external terminal when mounting the semiconductor device on a circuit substrate, as compared to the conventional semiconductor device having no lead projection, and a stress when generated can be satisfactorily absorbed by the soft bonding material having the increased thickness, thereby preventing a crack from being formed in the package.

Still another object of the present invention is to provide a semiconductor device comprising a semiconductor chip, a package encapsulating the semiconductor chip, the package having a wall surface, a plurality of leads each having one end electrically connected to the semiconductor chip and another end exposed at the wall surface of the package to form an external terminal, each of the leads excluding the external terminal being encapsulated within the package, and a lead recess provided on the external terminal of the lead, the lead recess being caved in from the wall surface of the package. According to the semiconductor device of the present invention, it is possible to increase a thickness of a soft bonding material which is arranged on the external terminal when mounting the semiconductor device on a circuit substrate, as compared to the conventional semiconductor device having no lead recess, and a stress when generated can be satisfactorily absorbed by the soft bonding material having the increased thickness, thereby preventing a crack from being formed in the package.

A further object of the present invention is to provide a semiconductor device mounting structure for mounting a semiconductor device on a surface of a circuit substrate using a soft bonding material, the semiconductor device comprising a semiconductor chip, a package encapsulating the semiconductor chip and having a wall surface, and a plurality of leads each having one end electrically connected to the semiconductor chip and another end exposed at the wall surface of the package to form an external terminal, each of the leads excluding the external terminal being encapsulated within the package, where the semiconductor device mounting structure comprises a spacer supporting the semiconductor device on the circuit substrate in a state where the semiconductor device is separated from the surface of the circuit substrate, a gap being formed between the semiconductor device and the circuit substrate, and a soft bonding material arranged at the gap and bonding the semiconductor device and the circuit substrate. According to the semiconductor device mounting structure of the present invention, it is possible to increase a thickness of a soft bonding material which is arranged on the external terminal when mounting the semiconductor device on the circuit substrate, as compared to the conventional semiconductor device mounting structure having no spacer, and a stress when generated can be satisfactorily absorbed by the soft bonding material having the increased thickness, thereby preventing a crack from being formed in the package. As a result, the mounting characteristic and reliability of the semiconductor device is improved when mounting the semiconductor device on the circuit substrate.

Another object of the present invention is to provide a semiconductor device mounting structure for mounting a semiconductor device on a surface of a circuit substrate using a soft bonding material, the semiconductor device comprising a semiconductor chip, a package encapsulating the semiconductor chip and having a wall surface, and a plurality of leads each having one end electrically connected to the semiconductor chip and another end exposed at the wall surface of the package to form an external terminal, each of the leads excluding the external terminal being encapsulated within the package, the soft bonding material being arranged on the external terminal of on connection electrodes provided on the circuit substrate, where the semiconductor device mounting structure comprises a bonding portion bonding the external terminal of the semiconductor device to the connection electrode of the circuit substrate at a first location of the semiconductor device, and a bonding portion bonding the external terminal of the semiconductor device to the connection electrode of the circuit substrate at a second location of the semiconductor device different from the first location, where a distance between the semiconductor device and the circuit substrate at the first location is greater than that at the second location, and an amount of soft bonding material forming the first bonding portion is greater than an amount of soft bonding material forming the second bonding portion. According to the semiconductor device mounting structure of the present invention, it is possible to positively bond and connect the semiconductor device and the circuit substrate even if a warp is generated in the semiconductor device.

Still another object of the present invention is to provide a semiconductor device comprising a semiconductor chip, a package encapsulating the semiconductor chip, the package having a wall surface, a plurality of leads each having one end electrically connected to the semiconductor chip and another end exposed at the wall surface of the package to form an external terminal, each of the leads excluding the external terminal being encapsulated within the package, and a lead projection provided on the external terminal of the lead, the lead projection projecting from the wall surface of the package and having a width which is smaller at a tip end portion of the lead projection than at the wall surface of the package. According to the semiconductor device of the present invention, it is possible to increase an area of the external terminal that is plated, thereby improving the wetting characteristic with respect to solder and also improving the reliability when bonding the semiconductor device and the circuit substrate.

A further object of the present invention is to provide a semiconductor device comprising a semiconductor chip, a package encapsulating the semiconductor chip, the package having a wall surface, a plurality of leads each having one end electrically connected to the semiconductor chip and another end exposed at the wall surface of the package to form an external terminal, each of the leads excluding the external terminal being encapsulated within the package, and a lead projection provided on the external terminal of the lead, the lead projection projecting from the wall surface of the package and having a thickness which is smaller at a tip end portion of the lead projection than at the wall surface of the package. According to the semiconductor device of the present invention, it is possible to increase an area of the external terminal that is plated, thereby improving the wetting characteristic with respect to solder and also improving the reliability when bonding the semiconductor device and the circuit substrate.

Other objects and further features of the present invention will be apparent from the following detailed description when read in conjunction with the accompanying drawings.

BRIEF DESCRIPTION OF THE DRAWINGS

FIG. 38 is a bottom view showing an arrangement of external terminals;

FIGS. 39A and 39B respectively are a cross sectional view and a bottom view for explaining a nineteenth embodiment of the semiconductor device according to the present invention;

FIGS. 40A and 40B respectively are a cross sectional view and a bottom view for explaining a twentieth embodiment of the semiconductor device according to the present invention;

FIG. 41 is a cross sectional view for explaining a twenty-first embodiment of the semiconductor device according to the present invention;

DESCRIPTION OF THE PREFERRED EMBODIMENTS

A description will be given of a first aspect of the present invention. According to the first aspect of the present invention, the size of a semiconductor device can be sufficiently reduced.

Figure 3A:
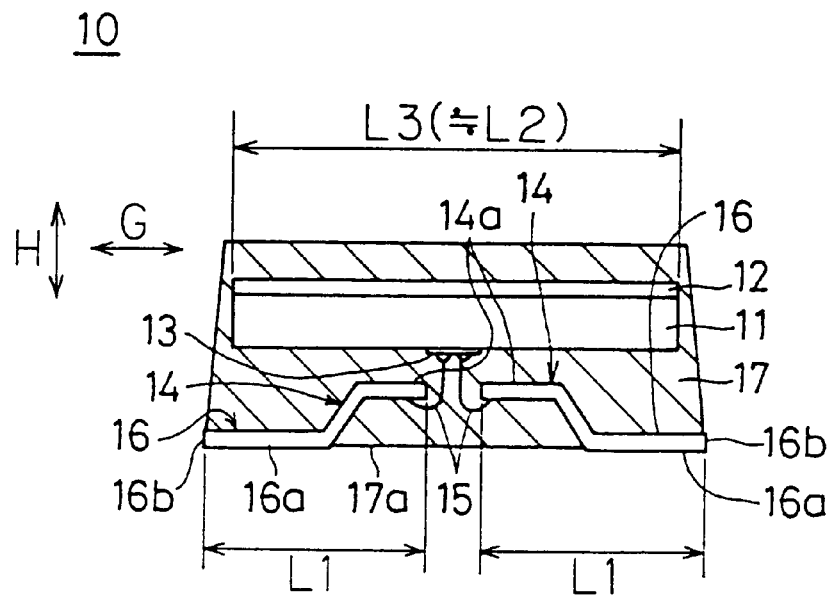
FIGS. 3A and 3B respectively are a cross sectional view and a perspective view showing a first embodiment of a semiconductor device according to the present invention.

A description will be given of a first embodiment of the semiconductor device according to the present invention, by referring to FIGS. 3A and 3B. FIG. 3A shows a cross sectional view of the first embodiment, and FIG. 3B shows a perspective view of the first embodiment.

Figure 3B:
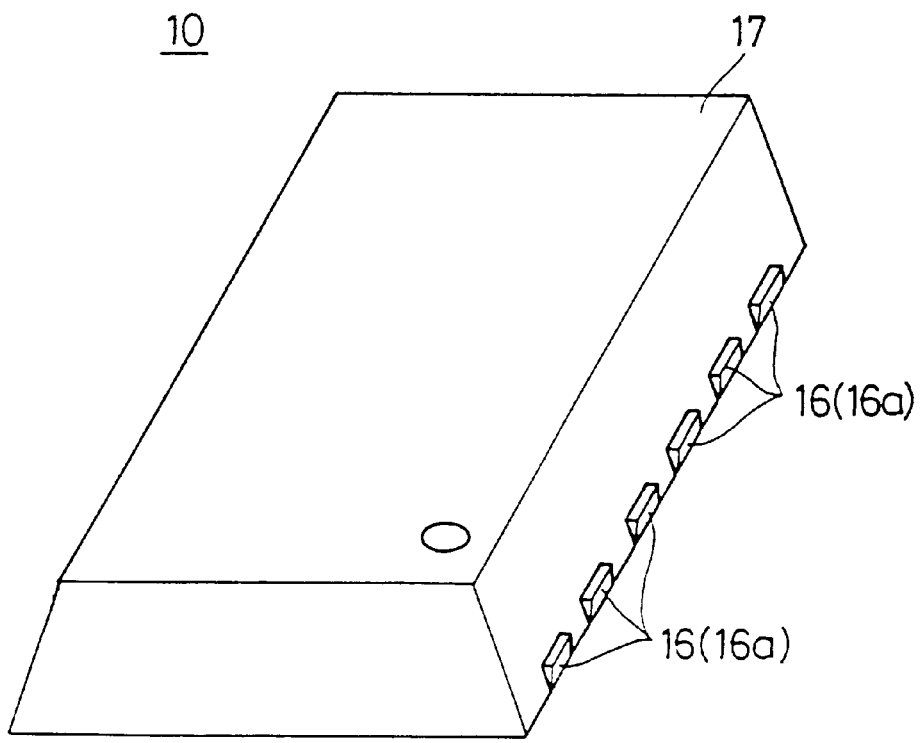

A semiconductor device 10 shown in FIGS. 3A and 3B includes a semiconductor chip 11 which is mounted on a stage 12. For example, this semiconductor chip 11 is a memory chip which is relatively large. In addition, electrode pads 13 of the semiconductor chip 11 are arranged at the central part on the top surface of the semiconductor chip 11 along the longitudinal direction thereof, as may be seen from FIG. 5A which will be described later.

One end 14a of each lead 14 is connected to the electrode pad 13 of the semiconductor chip 11 via a wire 15. In addition, each lead 14 is bent with respect to a direction H which is taken along the height of the semiconductor device 10, and has an approximate Z-shape when view from the side as shown in FIG. 3A. Accordingly, each lead 14 first extends horizontally from the end 14a in FIG. 13A, thereafter extends down, and then extends horizontally again at the other end. As will be described later, the end of the lead 14 opposite to the end 14a forms an external terminal 16.

A resin package 17 encapsulates the semiconductor chip 11, the wires 15 and the plurality of leads 14. In the plan view, this package 17 has a size which is approximately the same as (or slightly larger than) the area of the semiconductor chip 11. In other words, the package 17 is considerably small compared to the conventional package.

Figure 4:
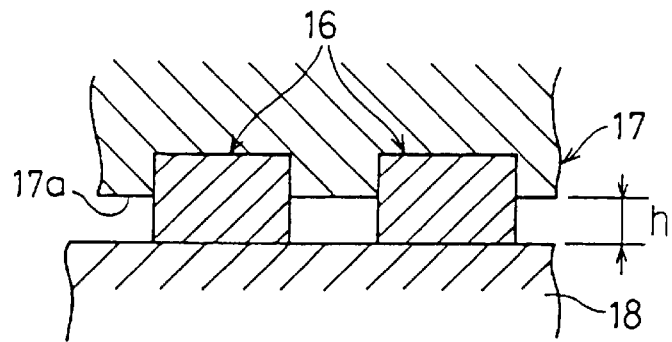
FIG. 4 is a cross sectional view on an enlarged scale showing the first embodiment of the semiconductor device in a vicinity of external terminals.

A bottom portion 16a and an end portion 16b of the external terminal 16 of the lead 14 are exposed at a bottom surface 17a of the package 17. Hence, the semiconductor device 10 is mounted on a circuit substrate 18 which is shown in FIG. 4 by soldering the external terminals 16 to the circuit substrate 18. As shown in FIG. 4, the external terminal 16 slightly projects from the bottom surface 17a of the package 17. Accordingly, a gap h is formed between the top surface of the circuit substrate 18 and the bottom surface 17a of the package 17, so as to improve the soldering characteristics. For example, the external terminal 16 can be made to project from the bottom surface 17a of the package 17 by forming a groove in the mold at a position corresponding to the external terminal 16 when carrying out a resin molding to form the package 17. In other words, the external terminal 16 can be made to project from the bottom surface 17a of the package 17 with relative ease.

Of course, it is not essential to make the external terminal 16 project a distance h from the bottom surface 17a of the package 17. That is, h may be equal to 0 so that the bottom surface 17a of the package 17 may make contact with the top surface of the circuit substrate 18. Therefore, the distance h may be set to satisfy a relationship h≦t, where t denotes the thickness of the lead 14.

Next, a description will be given of the construction of the semiconductor device 10 by referring again to FIG. 3A. In the plan view of the semiconductor device 10, the leads 14 and the semiconductor chip 11 overlap each other within the package 17.

If a length of each lead 14 in a horizontal direction G is denoted by L1, an amount of overlap L2 between the lead 14 and the semiconductor chip 11 can be described by L2≈2·L1. Since the area of the package 17 and the area of the semiconductor chip 11 in the plan view are approximately the same, the length of the semiconductor device 10 in the horizontal direction G becomes L3 if a length of the semiconductor chip 11 is denoted by L3.

Figure 1:
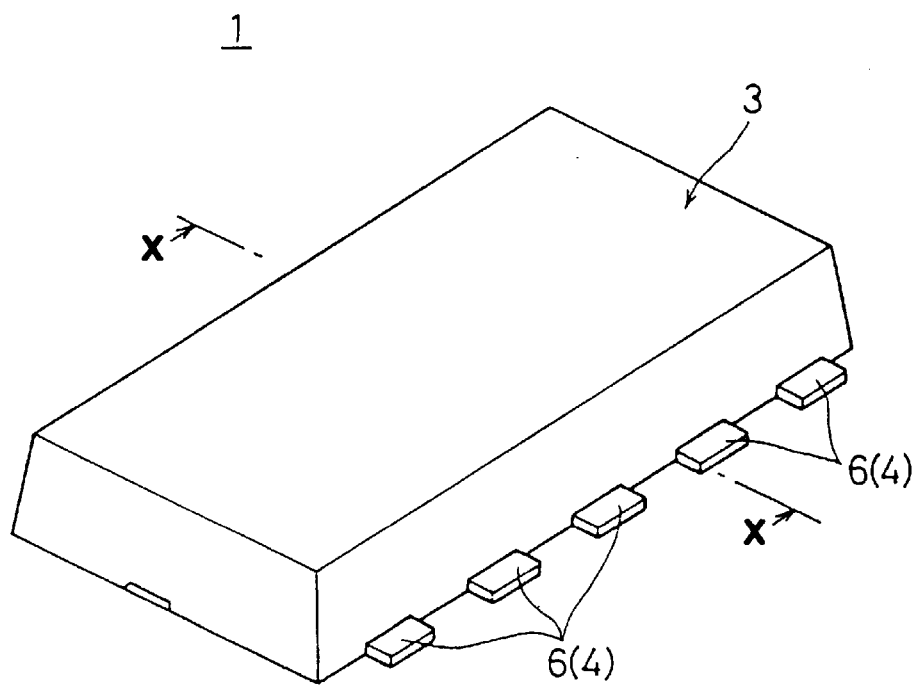
FIG. 1 is a perspective view showing an example of a conventional semiconductor device.
Figure 2:
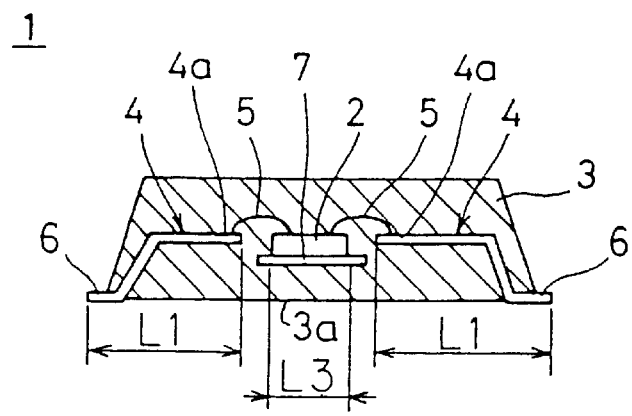
FIG. 2 is a cross sectional view of the semiconductor device taken along a line X—X in FIG. 1.

On the other hand, according to the conventional semiconductor device 1 shown in FIGS. 1 and 2, a length L4 of the package 3 is approximately a sum of the length L3 of the semiconductor chip 11, the length L1 of the leads 4 on one side, and the length of the leads 4 on the other side of the semiconductor chip 2. In other words, L4=L3+2·L1.

Therefore, it may be seen that the size of the semiconductor device 10 of this embodiment can be reduced by the overlap L2 compared to the size of the conventional semiconductor device 1. In addition, because the semiconductor device 10 is considerably small compared to the conventional semiconductor device 1, it is possible to improve the mounting efficiency of the semiconductor device 10 with respect to the circuit substrate 18, and thereby reduce the size and improve the performance of the equipments which are mounted with the semiconductor device 10.

Next, a description will be given of an embodiment of a method of producing the semiconductor device according to the present invention, by referring to FIGS. 5 through 9. This embodiment of the method produces the semiconductor device 10 described above.

Figure 5A:
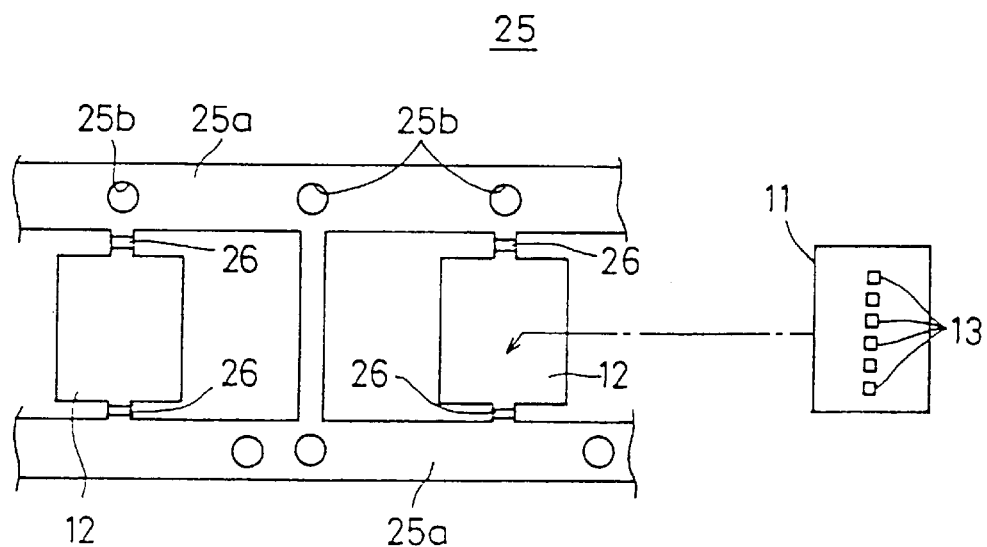
FIGS. 5A and 5B respectively are a plan view and a side view for explaining an embodiment of a method of producing the semiconductor device according to the present invention.
Figure 5B:
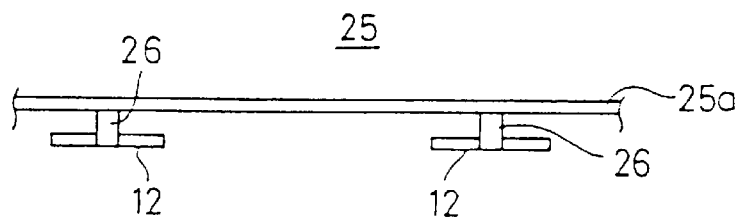

FIG. 5A shows a plan view of a lead frame 25 having stages 12 on which the semiconductor chip 11 is mounted, and FIG. 5B shows a side view of this lead frame 25. Frame portions 25a, the stages 12, and support bars 26 for supporting the stages 12 on the frame portions 25a shown in FIG. 5A are formed by press-working, stamping or etching processes. The support bar 26 has a stepped portion, so that the stage 12 is located at a position lower than that of the frame portion 25a, as shown in FIG. 5B.

Figure 6:
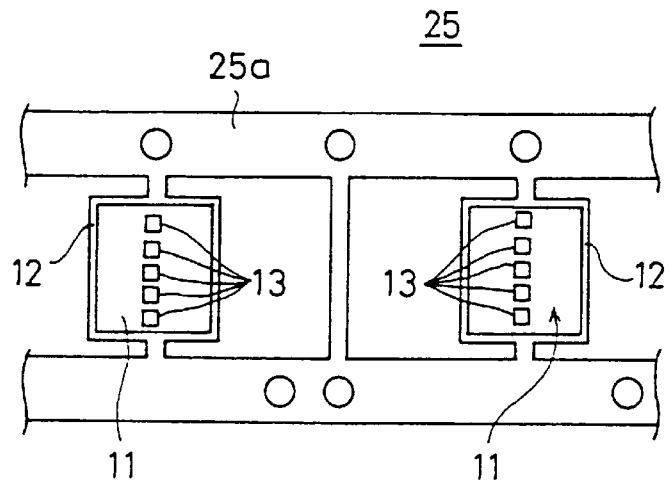
FIG. 6 is a plan view for explaining the embodiment of the method of producing the semiconductor device according to the present invention.

After the lead frame 25 is formed, the semiconductor chip 11 is die-bonded on the stage 12. FIG. 6 shows the lead frame 25 which is mounted with the semiconductor chips 11. As described above, the electrode pads 13 of the semiconductor chip 11 are arranged at the central portion on the top surface of the semiconductor chip 11.

Figure 7A:
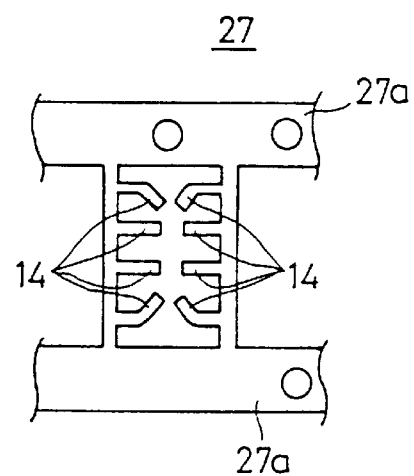
FIGS. 7A and 7B respectively are a plan view and a side view for explaining the embodiment of the method of producing the semiconductor device according to the present invention.
Figure 7B:
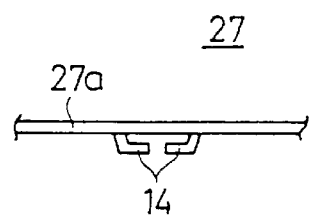

On the other hand, FIG. 7A shows a plan view of a lead frame 27 for forming the leads 14, and FIG. 7B shows a side view of this lead frame 27. The lead frame 27 is formed independently of the lead frame 25, by carrying out press-working, punching or etching processes. Frame portions 27a and a plurality of leads 14 are formed on the lead frame 27, and the leads 14 extend towards the inside for a predetermined length. In addition, the leads 14 are located at a position lower than that of the frame portion 27a. The leads 14 may be made to extend for this predetermined length by merely modifying the mold which is used for the press-working, and thus, the above described leads 14 can be formed with ease.

Figure 8A:
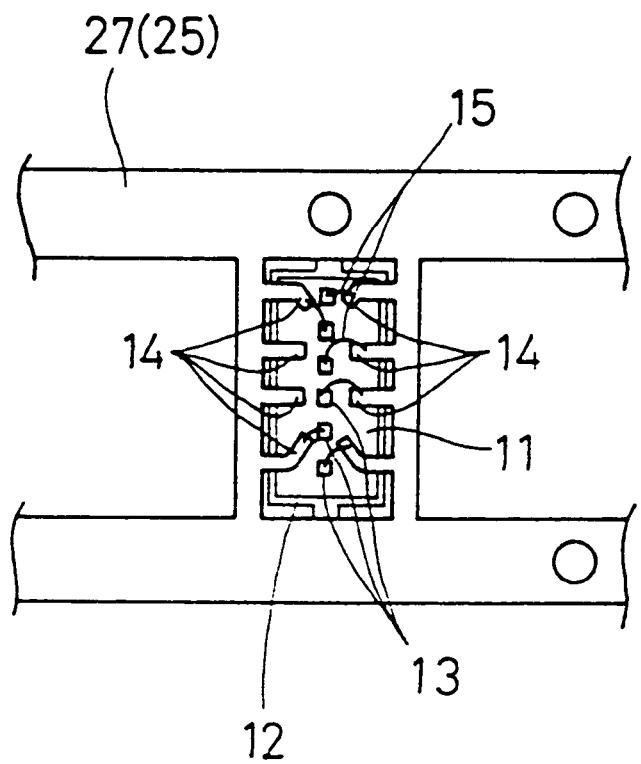
FIG. 8A and 8B respectively are a plan view and a side view for explaining the embodiment of the method of producing the semiconductor device according to the present invention.
Figure 8B:
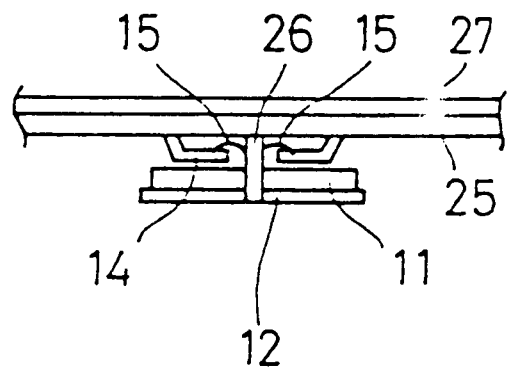

FIGS. 8A and 8B respectively are a plan view and a side view showing the lead frame 25 and the lead frame 27 in an overlapping stage. More particularly, the lead frame 27 is placed on top of the lead frame 25. The lead frames 25 and 27 can be positioned with ease by matching positioning holes 25b and 27b of the respective lead frames 25 and 27.

As described above, the leads 14 of the lead frame 27 extend to the inside for the predetermined length and are lower than the frame portions 27a by a predetermined amount. Accordingly, in the overlapping stage of the lead frames 25 and 27, the leads 14 extend to the vicinities of the electrode pads of the semiconductor chip 11 which is mounted on the lead frame 25. That is, the leads 14 overlap the semiconductor chip 11 in the plan view.

After the lead frames 25 and 27 are positioned in the overlapping stage, the ends 14a of the leads and the electrode pads 13 of the semiconductor chip 11 are wire-bonded. As a result, the leads 14 and the electrode pads 13 are electrically connected via the wires 15.

When the wire-bonding process ends, the lead frames 25 and 27 are loaded into a mold which is used to form the package 17 by a resin molding process. When molding this package 17, it is possible to employ the transfer mold technique as the package forming method because the external leads 16 of the leads 14 are exposed to the outside. In other words, the leads 14 are embedded within the package 17 and only the external terminals 16 are exposed at the bottom surface of the package 17. For this reason, it is possible to form the package 17 with ease using the mold, and the production cost can be reduced because of the improved production yield.

After the package 17 is formed by the resin molding process, unwanted portions of the lead frames 25 and 27 are cut and removed, thereby completing the semiconductor device 10 shown in FIGS. 3A and 3B.

Hence, this embodiment of the method is characterized by the steps of (i) overlapping the lead frames 25 and 27, and (ii) extending the leads of the lead frame 27 to the inside for the predetermined length. The step (i) itself is already employed in a LOC (Lead On Chip) type semiconductor device production process, and the step (ii) can be realized by modifying the mold which is used when forming the lead frame 27. Therefore, it is possible to produce the semiconductor device 10 without greatly modifying the conventional semiconductor device production process.

Figure 9A:
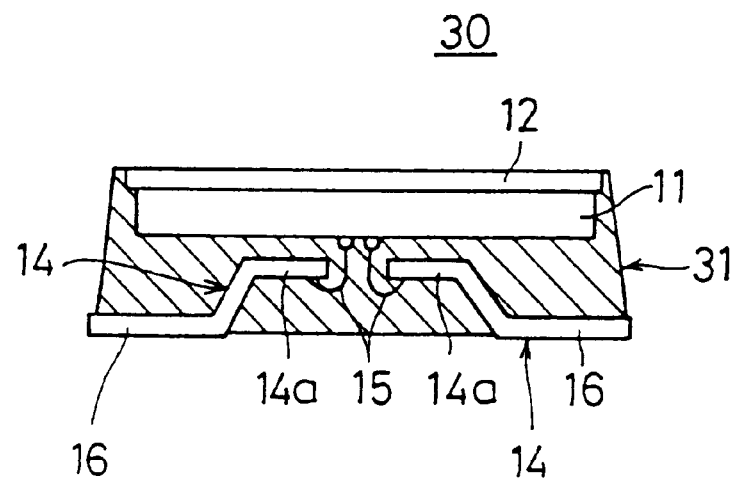
FIGS. 9A and 9B respectively are a cross sectional view and a perspective view showing a second embodiment of the semiconductor device according to the present invention.
Figure 9B:
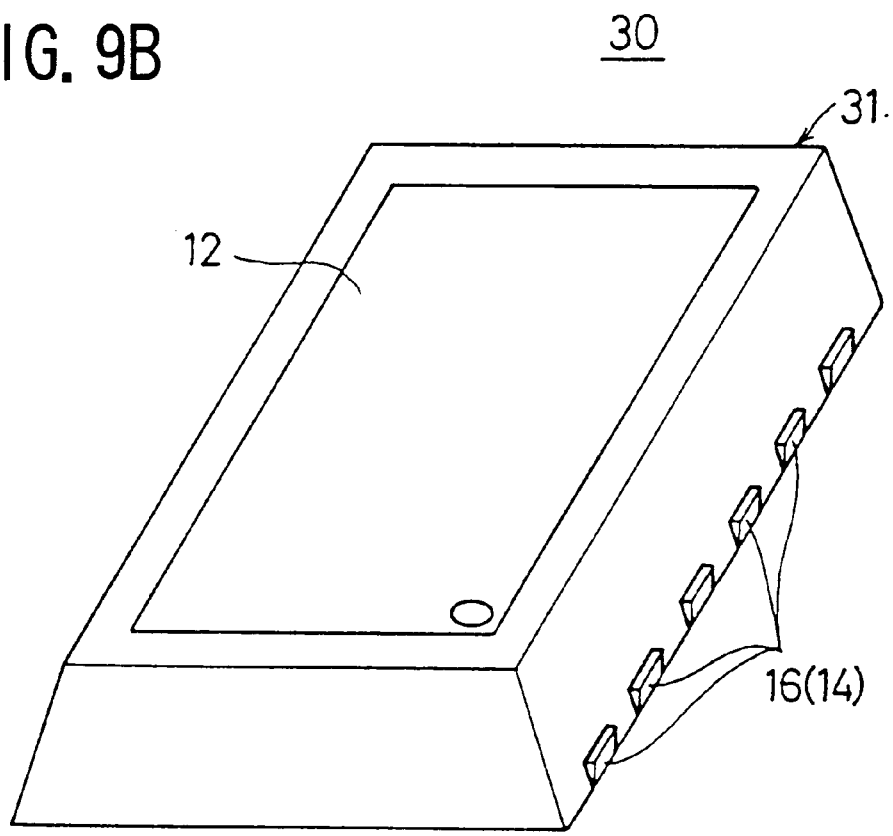

Next, a description will be given of a second embodiment of the semiconductor device according to the present invention, by referring to FIGS. 9A and 9B. FIG. 9A shows a cross section of the second embodiment of the semiconductor device, and FIG. 9B shows a perspective view of the second embodiment of the semiconductor device. In FIGS. 9A and 9B, those parts which are the same as those corresponding parts in FIGS. 3A and 3B are designated by the same reference numerals, and a description thereof will be omitted.

A semiconductor device 30 shown in FIGS. 9A and 9B has the stage 12 which is exposed at a top portion of a package 31, so as to improve the heat radiation efficiency of the heat which is generated from the semiconductor chip 11 which is mounted on the stage 12. This semiconductor device 30 can easily be produced by carrying out the resin molding process in a stage where the stage 12 makes direct contact with a cavity of the mold which is used for the resin molding.

The heat which is generated from the semiconductor chip 11 is efficiently radiated outside the package 30 via the stage 12 which is exposed at the top portion of the package 31. Accordingly, it is possible to improve the heat radiation efficiency of the semiconductor chip 11. In addition, unlike the semiconductor device 10 shown in FIGS. 3A and 3B, no resin exists above the stage 12, and the thickness of the semiconductor device 30 can be reduced by a corresponding amount.

Figure 10A:
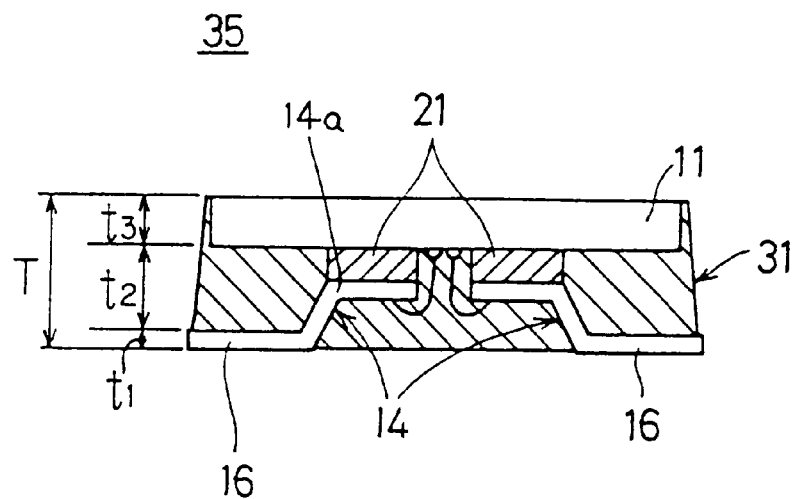
FIGS. 10A, 10B and 10C respectively are cross sectional views showing first, second and third modifications of the second embodiment of the semiconductor device.

FIG. 10A shows a first modification of the second embodiment of the semiconductor device. In FIG. 10A, those parts which are the same as those corresponding parts in FIGS. 9A and 9B are designated by the same reference numerals, and a description thereof will be omitted.

In this first modification, the semiconductor chip 11 is exposed at the top portion of the package 31 in a LOC type semiconductor device 35, so as to improve the heat radiation efficiency similarly to the semiconductor device 30 shown in FIGS. 9A and 9B.

In the first and second embodiments, the resin of the package 17 or 31 fills the space between the semiconductor chip 11 and the end portions 14a of the leads 14. But in this first modification, the tip portions 14a of the leads 14 are adhered on the semiconductor chip 11 via adhesive tapes 21. Because the top surface of the semiconductor chip 11 is directly exposed at the top portion of the package 31, it is possible to further improve the heat radiation efficient and further reduce the thickness of the semiconductor device 35 compared to the semiconductor device 30.

In this first modification, a thickness t1 of the lead 14 is approximately 0.018 μm to 0.150 μm, a distance t2 between the top surface of the lead 14 and the bottom surface of the semiconductor chip 11 is approximately 0.100 μm to 200 μm, and a thickness t3 of the semiconductor chip 11 is approximately 200 μm to 400 μm. Accordingly, a thickness T of the semiconductor device 35 is approximately 200.118 μm if the minimum values for t1, t2 and t3 are used. Hence, it can be seen that the thickness T of the semiconductor device 35 is extremely small.

Figure 10B:
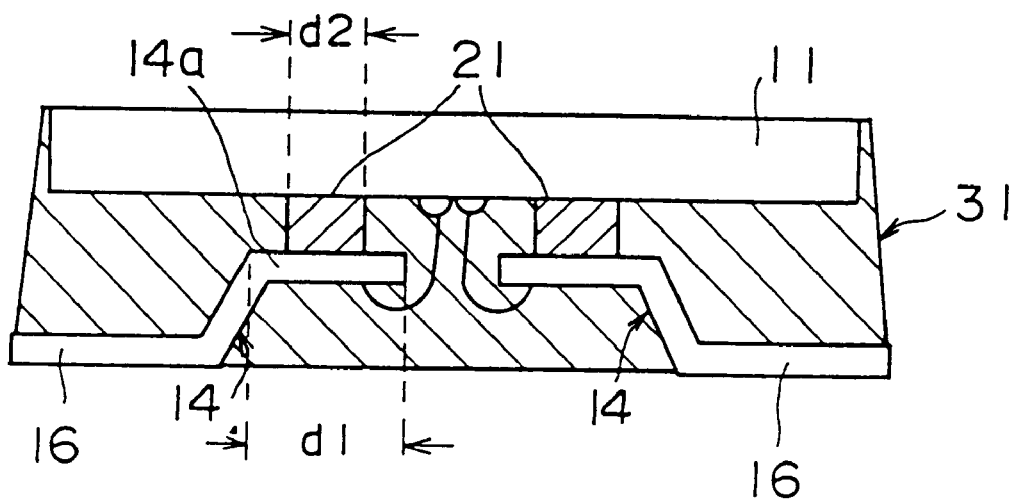

FIG. 10B shows a second modification of the second embodiment of the semiconductor device. In FIG. 10B, those parts which are the same as those corresponding parts in FIG. 10A are designated by the same reference numerals, and a description thereof will be omitted.

In this second modification, a length d1 of the tip portion 14a of the lead 14 and a length d2 of the adhesive tape 21 satisfy a relationship d2≦d1. In other words, the adhesive tape 21 does not need to make contact with the tip end portion 14a of the lead 14 for the entire length of the tip end portion 14a. However, the length d2 is preferably greater than or equal to d1/2 so that the tip end portions 14a of the leads 14 are positively adhered to the semiconductor chip 11. For example, the thickness of the adhesive tape 21 is approximately 50 μm to 100 μm, and the thickness of the lead 14 is approximately 35 μm to 150 μm.

Figure 10C:
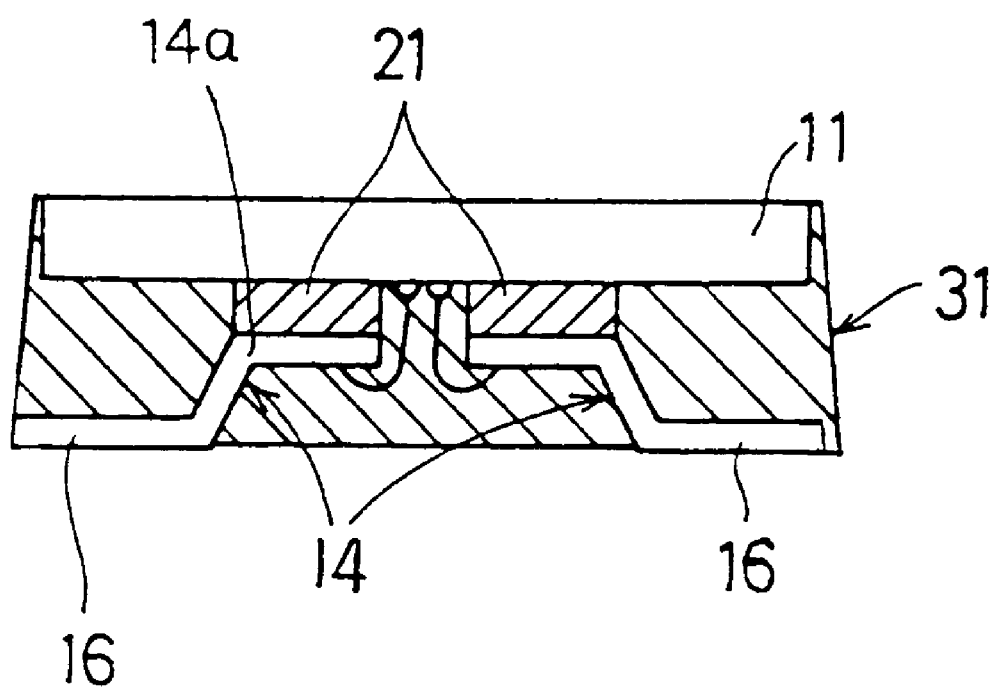

FIG. 10C shows a third modification of the second embodiment of the semiconductor device. In FIG. 10C, those parts which are the same as those corresponding parts in FIG. 10A are designated by the same reference numerals, and a description thereof will be omitted.

In this third modification, the external terminals 16 do not extend outside the package 31 in the horizontal direction in FIG. 10C. In other words, the end of the external terminal 16 and the side surface of the package 31 may match as shown on the left hand side of FIG. 10C or, the end of the external terminal 16 may be located on the inner side of the side surface of the package 31 as shown on the right hand side of FIG. 10C. In the latter case, the package 31 covers the side of the tip end of the external terminal 16.

Figure 11:
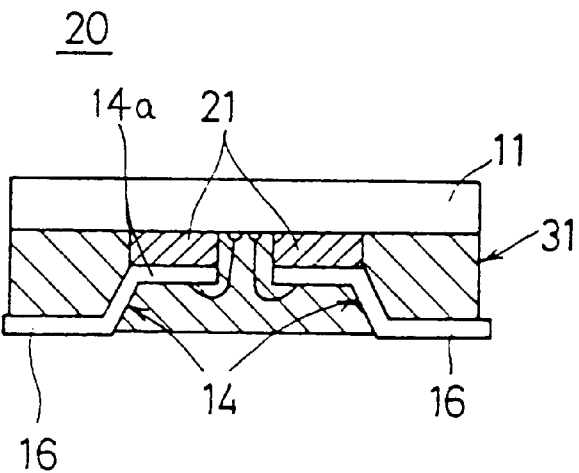
FIG. 11 is a cross sectional view showing a fourth modification of the second embodiment of the semiconductor device.

FIG. 11 shows a fourth modification of the second embodiment of the semiconductor device. In FIG. 11, those parts which are the same as those corresponding parts in FIGS. 9A and 9B are designated by the same reference numerals, and a description thereof will be omitted.

In this fourth modification, the size of the resin package 31 and the size of the semiconductor chip 11 of a semiconductor device 20 in a plan view are made the same as shown in FIG. 11. According to this fourth modification, the size of the semiconductor device 20 in the plan view can be minimized.

Figure 12A:
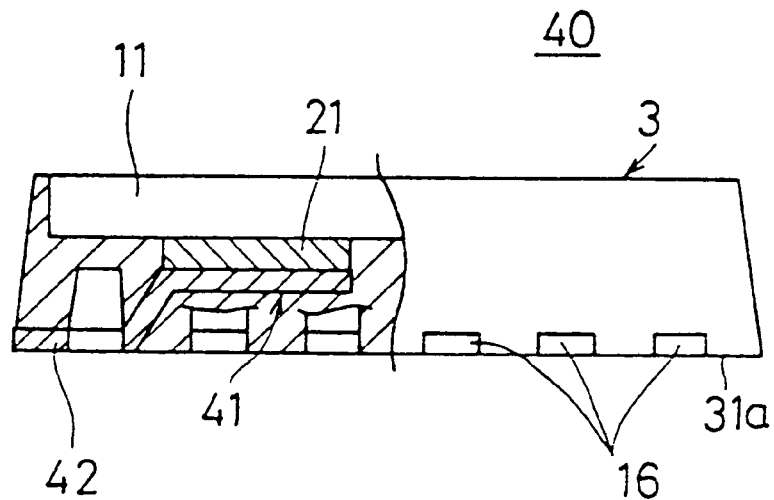
FIGS. 12A and 12B respectively are a cross sectional view in part and a bottom view showing a third embodiment of the semiconductor device according to the present invention.
Figure 12B:
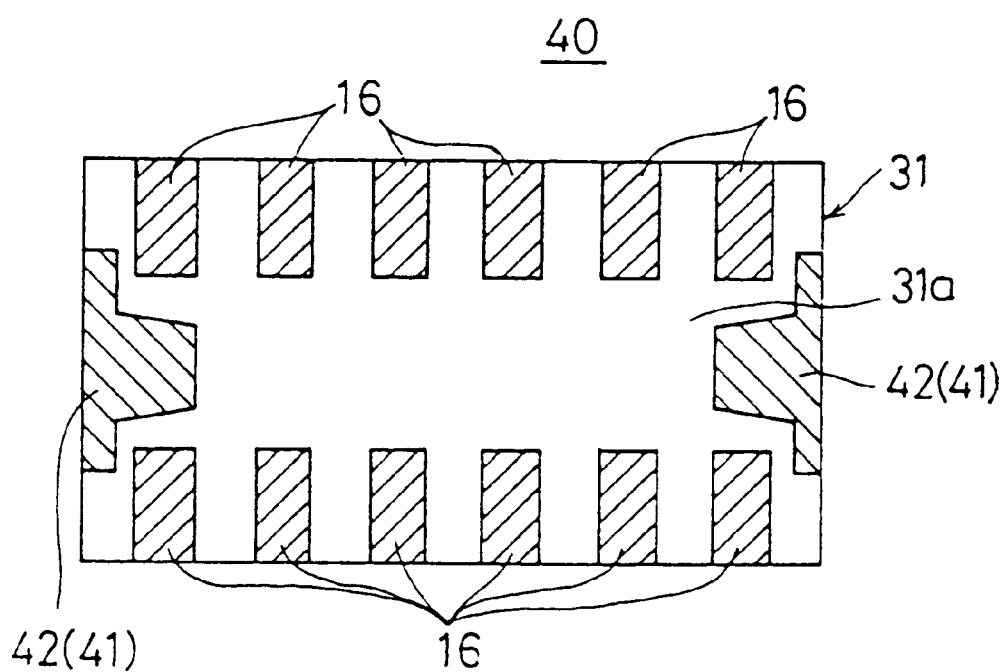

Next, a description will be given of a third embodiment of the semiconductor device according to the present invention, by referring to FIGS. 12A and 12B. FIG. 12A shows a partial cross section of the third embodiment, and FIG. 12B shows a bottom view of the third embodiment. In FIGS. 12A and 12B, those parts which are the same as those corresponding parts in FIGS. 9A and 9B are designated by the same reference numerals, and a description thereof will be omitted.

In this embodiment, a semiconductor device 40 is also the LOC type. The top surface of the semiconductor device 11 is exposed at the top portion of the package 31 as shown in FIG. 12A, similarly to the semiconductor device 20 shown in FIG. 11, so as to improve the heat radiation efficiency. In addition, a radiation frame 41 is provided under the semiconductor chip 11, and radiator portions 42 are provided at ends of the radiation frame 41. The radiator portions 42 are exposed at a bottom surface 31a of the package 31 as shown in FIG. 12B. The semiconductor chip 11 and the radiation frame 41 are connected via an adhesive tape 21 which is made of a material having a satisfactory thermal conduction, so that the heat generated from the semiconductor chip 11 is transferred to the radiation frame 41 via the adhesive tape 21 and radiated to the outside via the radiator portions 42.

According to this semiconductor device 40, the heat which is generated from the semiconductor chip 11 is not only radiated from the top surface of the semiconductor chip 11 which is exposed at the top portion of the package 31, but is also radiated from the bottom surface 31a of the package 31. As a result, the effective heat radiation area is increased, thereby making it possible to even further improve the heat radiation efficiency.

Figure 13:
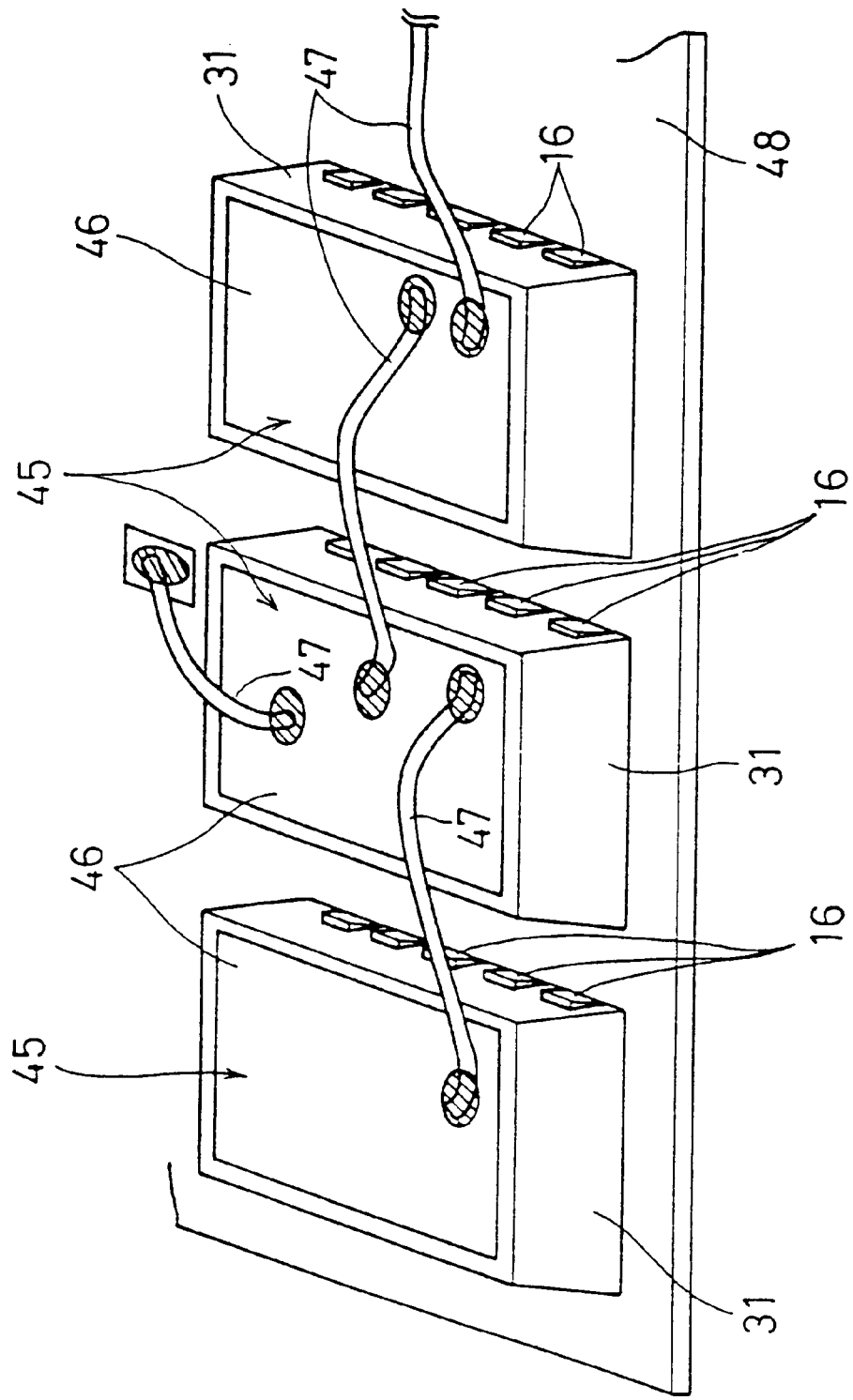
FIG. 13 is a perspective view showing a fourth embodiment of the semiconductor device according to the present invention.

FIG. 13 shows a fourth embodiment of the semiconductor device according to the present invention. In this embodiment, the top surfaces of the semiconductor chips 11 or the top surfaces of the stages 12 are exposed at the top portion of the package 31, similarly to the semiconductor devices 30, 35 and 40 described above. If the top surface of the semiconductor chip 11 is exposed, a metal film made of Au or the like is formed on this exposed surface by sputtering, for example. On the other hand, if the top surface of the stage 12 is exposed, a metal film made of Au, Ag or the like or a solder layer is plated on this exposed surface.

As a result, the conductor film formed on the exposed surface of the semiconductor chip 11 or stage 12 can be used as an electrical terminal 46. The potential of the semiconductor chip 11 is drawn out at the terminal 46.

According to this semiconductor device 46, the terminals 46 can be connected via jumper lines 47 or the like, so as to facilitate the wiring of the semiconductor devices 45 by enabling the wiring above the semiconductor devices 45 in addition to the wiring printed on a circuit substrate 48 on which the semiconductor devices 46 are mounted. In other words, the wiring of the semiconductor devices 46 can be designed with a larger degree of freedom, thereby improving the mounting efficiency.

Figure 14A:
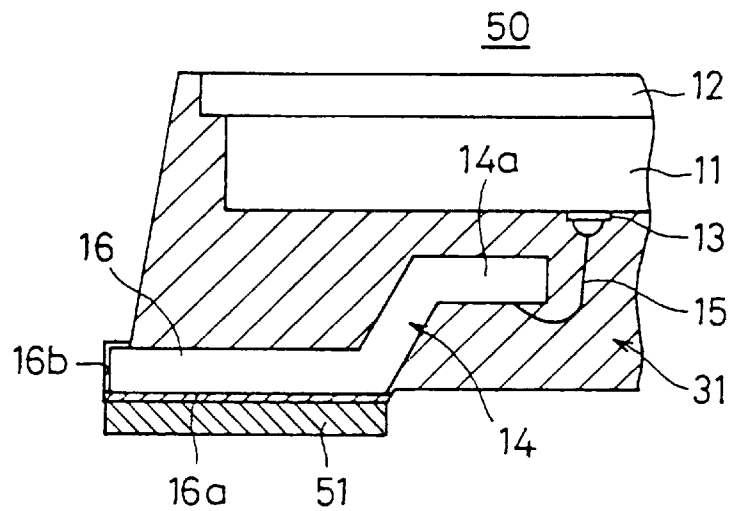
FIGS. 14A, 14B and 14C respective are a cross sectional view, a perspective view and a cross sectional view for explaining a fifth embodiment of the semiconductor device according to the present invention.
Figure 14B:
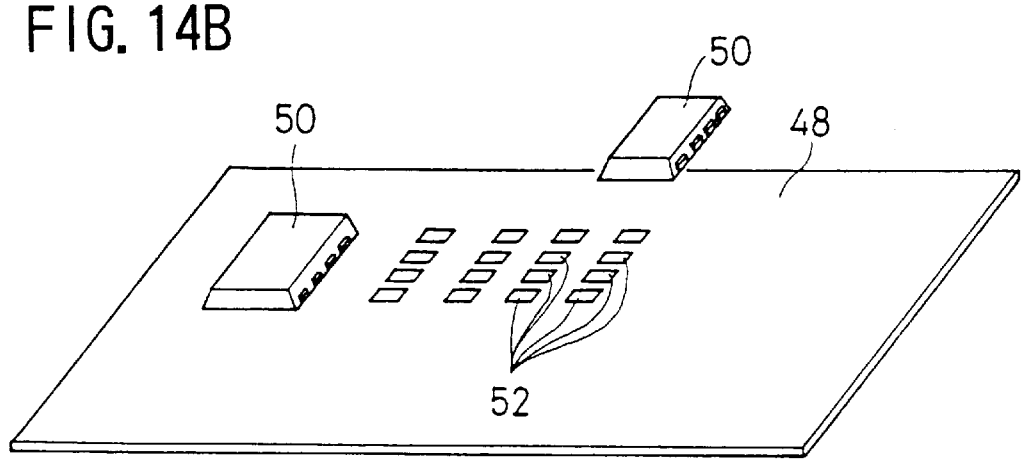
Figure 14C:
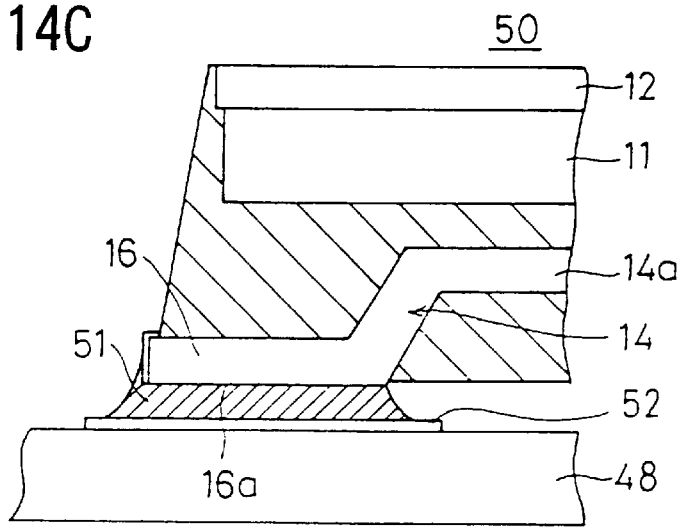

Next, a description will be given of a fifth embodiment of the semiconductor device according to the present invention, by referring to FIGS. 14A through 14C. FIG. 14A shows a cross sectional view of a part of this embodiment, FIG. 14B is a perspective view for explaining the mounting of this embodiment on a circuit substrate, and FIG. 14C is a cross sectional view of a part of this embodiment for explaining the mounting of this embodiment. In FIGS. 14A through 14C, those parts which are the same as those corresponding parts in FIGS. 9A and 9B are designated by the same reference numerals, and a description thereof will be omitted.

According to this embodiment, a semiconductor device 50 has the external terminals 16 with a processed bottom surface 16a. In other word, dimples similar to those formed on a golf ball are formed on the bottom surface 16a of the external terminal 16 of the lead 14 exposed outside the package 31. In addition, a conductive adhesive agent 51 which has a small elasticity is provided on the bottom surface 16a. Because the surface area of the external terminal 16 is increased by the dimples which are formed on the bottom surface 16a of the external terminal 16, the conductive adhesive agent 51 is positively adhered on the external terminal 16.

The leads 14 are made of a metal, while the circuit substrate 48 is generally made of a material such as epoxy-glass. Hence, the coefficients of thermal expansion of the materials forming the leads 14 and the circuit substrate 48 are different. As a result, when the semiconductor device 50 is mounted on the circuit substrate 48 and heated for soldering, a stress is generated due to the difference between the coefficients of thermal expansion. This stress may cause damage to the connecting portions and cause an electrical contact failure.

For this reason, the conductive adhesive agent 51 is provided on the bottom surface 16a of the external terminal 16 so as to prevent the stress from being generated due to the difference between the coefficients of thermal expansion of the leads 14 and the circuit substrate 48. In other words, the conductive adhesive agent 51 has a small elasticity but is thermally plastic, so that the difference between the thermal expansions of the external terminals 16 and the circuit substrate 48 can be absorbed by the conductive adhesive agent 51.

Therefore, according to this embodiment, it is possible to positively prevent damage to the semiconductor device 50 by preventing the stress from being generated in the semiconductor device 50 or the circuit substrate 48. In addition, when the semiconductor device 50 is shipped or forwarded, the conductive adhesive agent 51 is already provided on the external terminals 16. Hence, the user (or customer) does not need to carry out the usual soldering in order to mount the semiconductor device 50 on the circuit board 48. Hence, the mounting process carried out by the user is simplified, and the mounting cost is greatly reduced because no soldering equipment is necessary for the mounting process.

Of course, it is not essential that the conductive adhesive agent 51 is provided on the external terminal 16. The conductive adhesive agent 51 may be provided on each electrode pad 52 of the circuit substrate 48 shown in FIG. 14B on which the semiconductor device 50 is mounted. In this case, the external terminal 16 is adhered on the conductive adhesive agent 51 which is provided on the electrode pad 52, and a reflow process is carried out to thermally harden the conductive adhesive agent 51.

FIG. 14C shows a state where the external terminal 16 is connected to the electrode pad 52 of the circuit substrate 48 via the conductive adhesive agent 51 which is provided beforehand on the external terminal 16 as shown in FIG. 14A or on the electrode pad 52 shown in FIG. 14B.

Figure 15A:
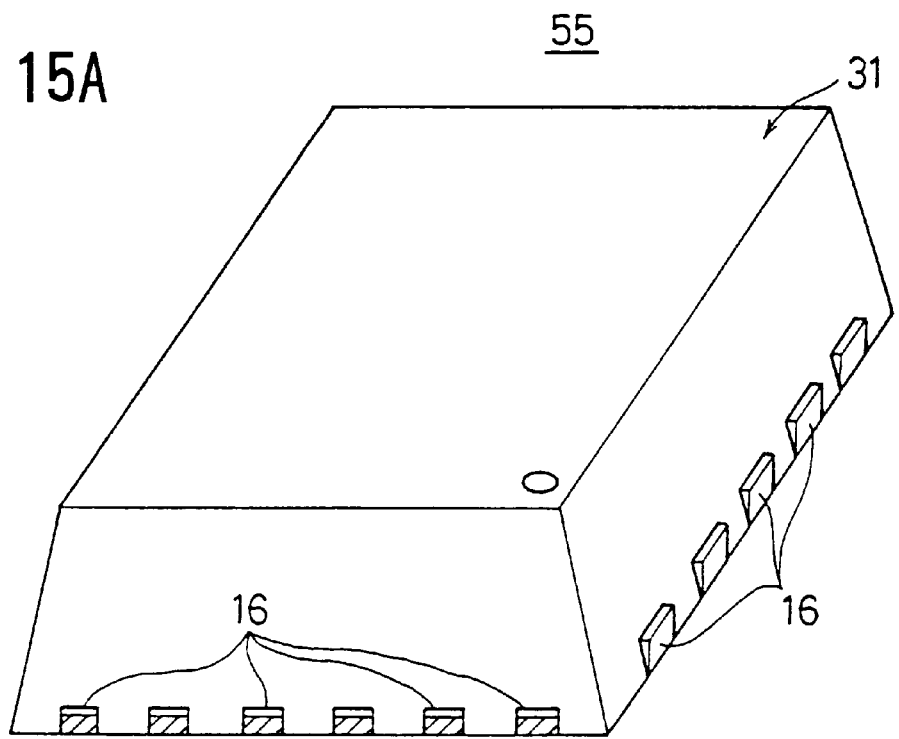
FIGS. 15A and 15B respectively are a perspective view and a bottom view showing a sixth embodiment of the semiconductor device according to the present invention.
Figure 15B:
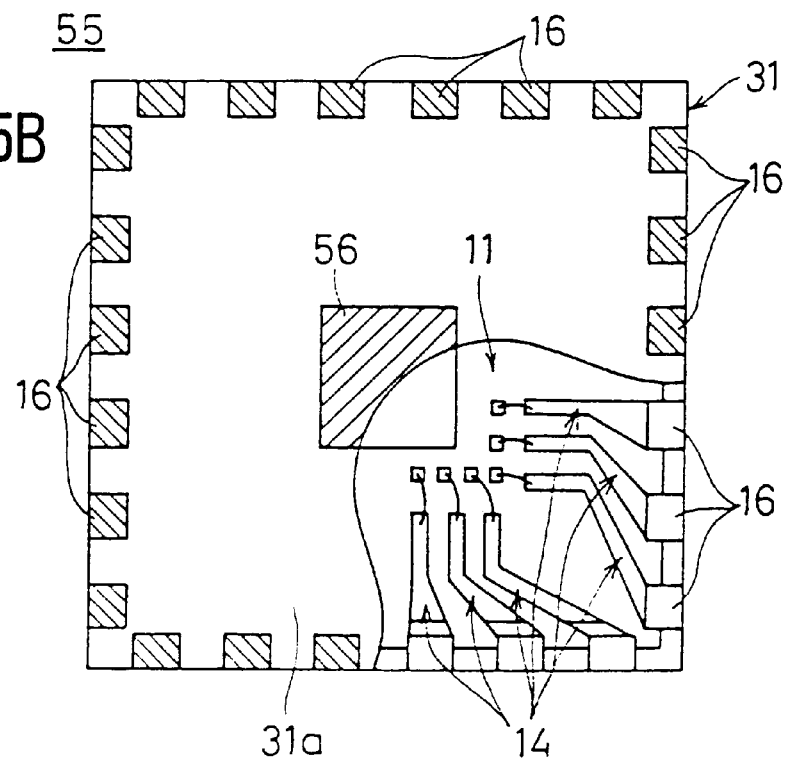

Next, a description will be given of a sixth embodiment of the semiconductor device according to the present invention, by referring to FIGS. 15A and 15B. FIG. 15A shows a perspective view of the sixth embodiment, and FIG. 15B shows a bottom view of the sixth embodiment. In FIGS. 15A and 15B, those parts which are the same as those corresponding parts in FIGS. 9A and 9B are designated by the same reference numerals, and a description thereof will be omitted.

In this embodiment, the present invention is applied to the so-called QFP (Quad Flat Package) type semiconductor device. In a semiconductor device 55 shown in FIGS. 15A and 15B, the leads 14 surround the semiconductor chip 11. In addition, a radiation frame 56 is provided with radiator fins.

Figure 16A:
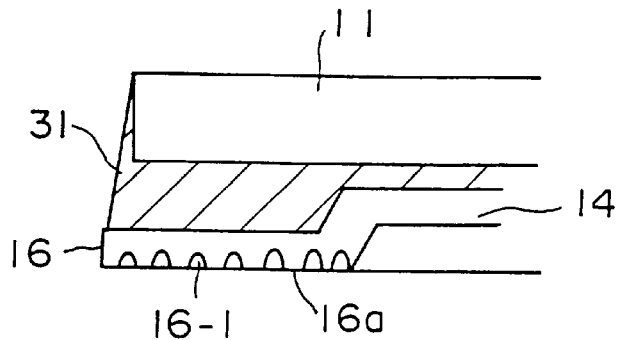
FIGS. 16A and 16B respectively are a cross sectional view and a bottom view showing a part of a seventh embodiment of the semiconductor device according to the present invention.
Figure 16B:
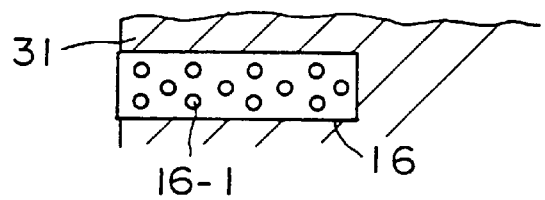

Next, a description will be given of a seventh embodiment of the semiconductor device according to the present invention, by referring to FIGS. 16A and 16B. FIG. 16A shows a cross section of a part of this seventh embodiment, and FIG. 16B shows a bottom view of a part of this seventh embodiment. In FIGS. 16A and 16B, those parts which are the same as those corresponding parts in FIG. 10A are designated by the same reference numerals, and description thereof will be omitted.

In this embodiment, a bottom surface 16a of the external terminal 16 of at least some of the leads 14 has dimples 16-1 formed thereon.

The conventional semiconductor device having the leads which extend outwards from the package can absorb to a certain extent the difference between the coefficients of thermal expansion of the leads and the circuit substrate on which the semiconductor device is mounted, because the outwardly extending leads are flexible and are shaped to absorb the difference. However, if the external terminals 16 do not extend outwardly of the package 31 and is substantially embedded within the package 31, it is desirable to take some kind of measure to increase the strength of the semiconductor device with respect to the stress which will be generated by the difference between the coefficients of thermal expansion of the leads 14 and the circuit substrate 48 on which the semiconductor device is mounted. Hence, this embodiment increases the surface area of the bottom surface 16a of the external terminal 16 to increase the strength. In addition to increasing the strength, it is possible to facilitate the coating of an adhesive agent on the external terminal 16, such as when applying the conductive adhesive agent 51 as described above in conjunction with FIGS. 14A through 14C.

Figure 17A:
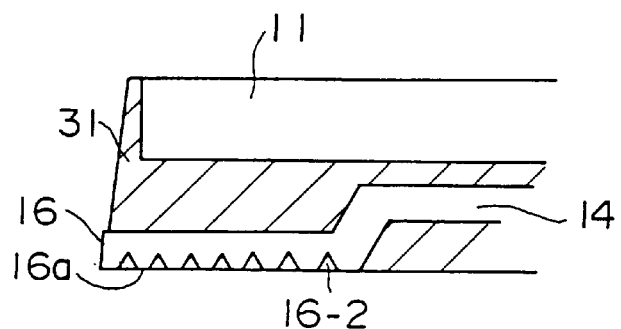
FIGS. 17A and 17B respectively are a cross sectional view and a bottom view showing a part of an eighth embodiment of the semiconductor device according to the present invention.
Figure 17B:
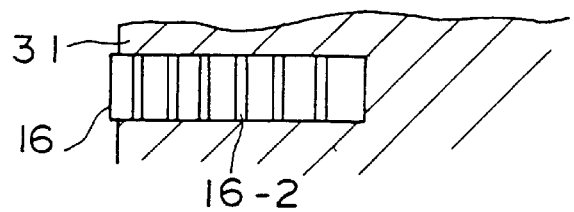

Next, a description will be given of an eighth embodiment of the semiconductor device according to the present invention, by referring to FIGS. 17A and 17B. FIG. 17A shows a cross section of a part of this eighth embodiment, and FIG. 17B shows a bottom view of a part of this eighth embodiment. In FIGS. 17A and 17B, those parts which are the same as those corresponding parts in FIG. 10A are designated by the same reference numerals, and description thereof will be omitted.

In this embodiment, a bottom surface 16a of the external terminal 16 of at least some of the leads 14 has grooves 16-2 formed thereon. The effects of this embodiment are basically the same as those of the seventh embodiment.

Figure 18:
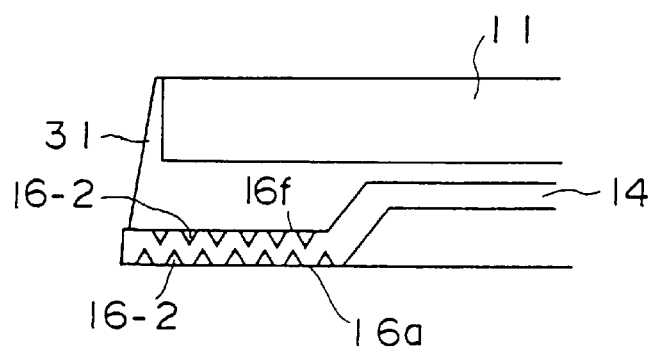
FIG. 18 is a cross sectional view showing a part of a ninth embodiment of the semiconductor device according to the present invention.

Next, a description will be given of a ninth embodiment of the semiconductor device according to the present invention, by referring to FIG. 18. FIG. 18 shows a cross section of a part of this ninth embodiment. In FIG. 18, those parts which are the same as those corresponding parts in FIG. 10A are designated by the same reference numerals, and description thereof will be omitted.

In this embodiment, both a top surface 16f and a bottom surface 16a of the external terminal 16 of at least some of the leads 14 have grooves 16-2 formed thereon. The effects of this embodiment are basically the same as those of the seventh embodiment.

Next, a description will hereinafter be given of a second aspect of the present invention. According to the second aspect of the present invention, it is possible to relieve a stress which is generated due to a difference between coefficients of linear thermal expansion of the semiconductor device and the circuit substrate, thereby improving the mounting characteristic and reliability of the semiconductor device when mounting the semiconductor device on the circuit substrate.

A description will be given of an example of a conventional semiconductor device mounting structure.

Figure 19:
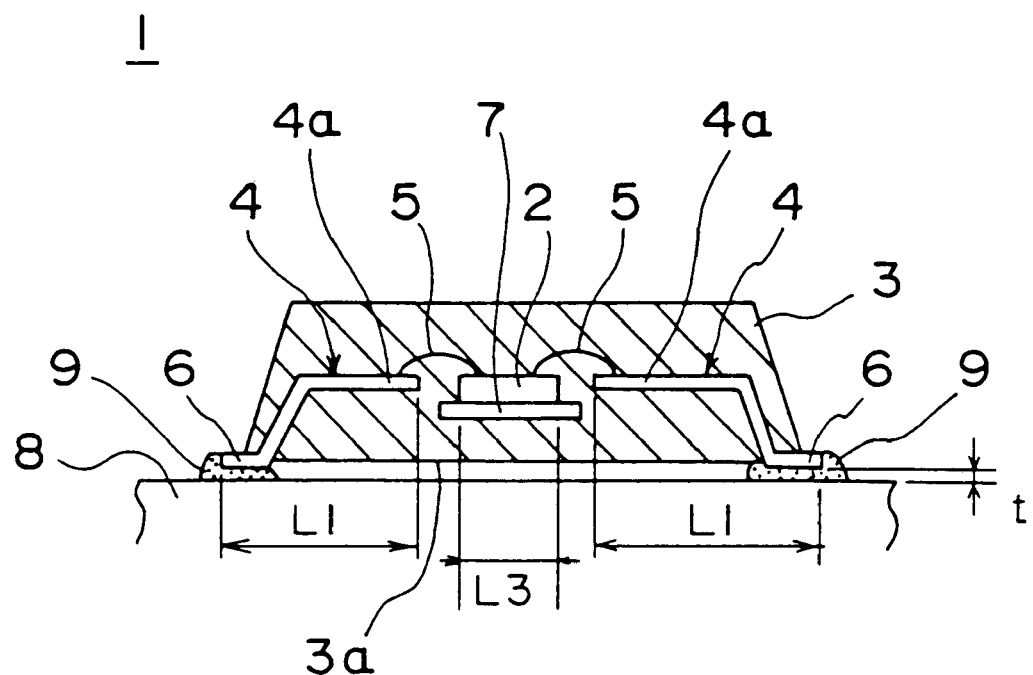
FIG. 19 is a cross sectional view of the semiconductor device taken along a line X—X in FIG. 1 when the semiconductor device is mounted on a circuit substrate.

The semiconductor device 1 shown in FIG. 1 is mounted on a circuit substrate 8 which is made of a material different from that of the semiconductor device 1, as shown in FIG. 19, for example. In FIG. 19, those parts which are the same as those corresponding parts in FIGS. 1 and 2 are designated by the same reference numerals, and a description thereof will be omitted. For this reason, coefficients of linear thermal expansion are different between the semiconductor device 1 and the circuit substrate 8. In addition, a thermal process such as a solder reflow process is carried out when mounting the semiconductor device 1 on the circuit substrate 8, and as shown in FIG. 19, the external terminals 6 are connected to the circuit substrate 8 using a solder 9. Accordingly, when the thermal process is carried out when mounting the semiconductor device 1 on the circuit substrate 8, stress is generated between the external terminals 6 and the circuit substrate 8 due to the above described difference between the coefficients of linear thermal expansion.

This stress did not become a problem in the case of a general and conventional package structure having relatively long leads extending outwardly of the package, such as a small outline package (SOP) and a quad flat package (QFP). According to such package structures having the relatively long leads extending outwardly of the package, the metal leads function as springs, and even if the stress is generated due to the difference between the coefficients of linear thermal expansions of the package and the circuit substrate, the leads resiliently deform and absorb the stress.

On the other hand, in the case of the semiconductor device 1 shown in FIGS. 1, 2 and 19, the portions of the leads 4 excluding the external terminals 6 are encapsulated within the package 3, and the stress cannot be absorbed by the resilient deformation of the leads 4. Hence, the stress which is generated due to the difference between the coefficients of linear thermal expansion of the semiconductor device 1 and the circuit substrate 8 is applied particularly at the connecting portions between the semiconductor device 1 and the circuit substrate 8. as result, in a worst case, the solder 9 arranged at the connecting portions are damaged, and there is a possibility of cracks being formed in the package 3.

Figure 20:
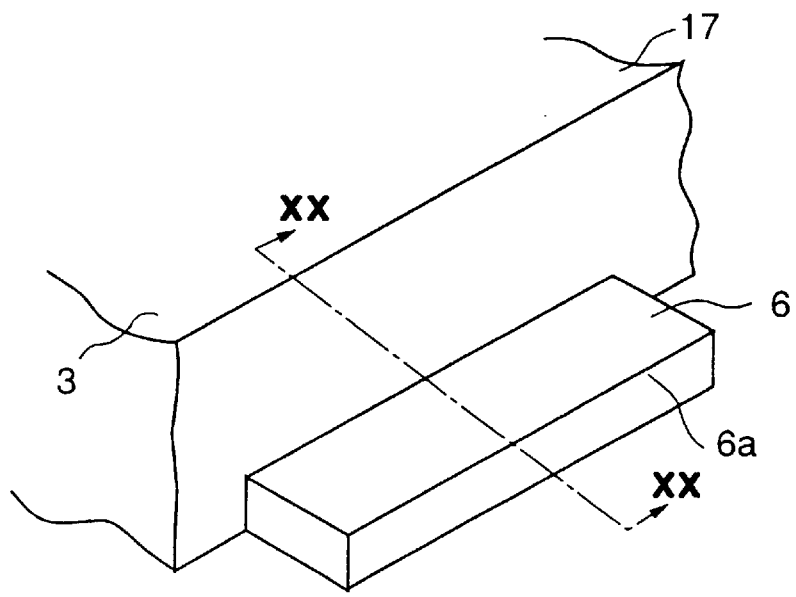
FIG. 20 is a perspective view, on an enlarged scale, showing external terminals of the semiconductor device shown in FIG. 1.

FIG. 20 is a perspective view, on an enlarged scale, showing the external terminal 6 of the semiconductor device 1 shown in FIGS. 1, 2 and 19. In addition, FIGS. 21A and 21B respectively are cross sectional views of the semiconductor device 1 taken along a line XX—XX in FIG. 20, showing the connecting portion of the solder 9 on an enlarged scale.

Normally, when producing the resin encapsulated type semiconductor device 1 shown in FIGS. 1, 2, 19, 20, 21A and 21B, a surface processing such as a plating process is carried out with respect to a lead frame after carrying out a resin encapsulation process, and then, a process such as a press-working is carried out to form the leads. By this press-working, the lead frame material becomes exposed at cut surfaces, and no surface processing is carried out with respect to these cut surfaces.

Figures 21A, 21B:
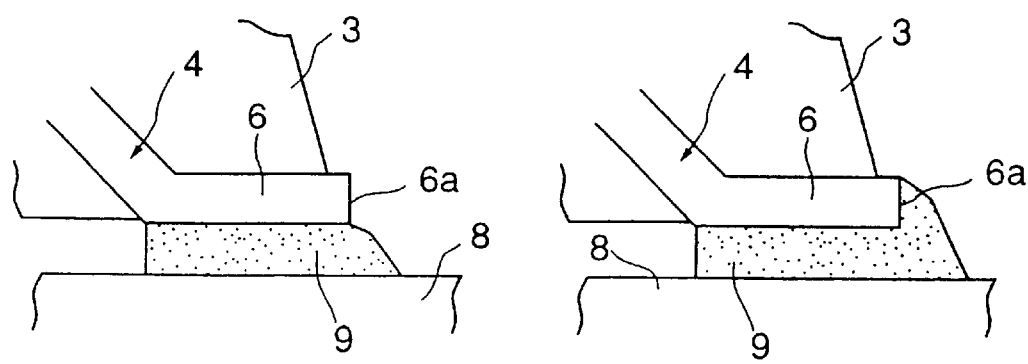
FIGS. 21A and 21B respectively are cross sectional views of the semiconductor device taken along a line XX—XX in FIG. 20 when the semiconductor device is mounted on the circuit substrate.

For this reason, when connecting the semiconductor device 1 on the circuit substrate 8 by use of the solder 9, the wetting characteristic of the solder 9 deteriorates at portions where the plating process has not been carried out. As shown in FIG. 21A, the solder 9 does not adhere on a cut surface 6a of the external terminal 6. On the other hand, in a desirable semiconductor device mounting structure, the solder 9 should cover all of the exposed portions of the external terminal 6 exposed from the package 3, as shown in FIG. 21B.

The mounting strength with which the semiconductor device 1 is mounted on the circuit substrate 8 is naturally proportional to the area over which the solder 9 contacts the external terminal 6. Hence, if unplated portions of the external terminal 6 increases, the mounting strength between the external terminal 6 and the circuit substrate 8 deteriorates.

Therefore, it is also desirable to improve the mounting strength and reliability of the semiconductor device with respect to the circuit substrate, in addition to reducing both the size and cost of the semiconductor device.

Next, a description will be given of embodiments in which the stress generated due to the difference between the coefficients of linear thermal expansion of the semiconductor device and the circuit substrate is relieved, so as to improve the mounting strength and the reliability of the semiconductor device.

Figure 22:
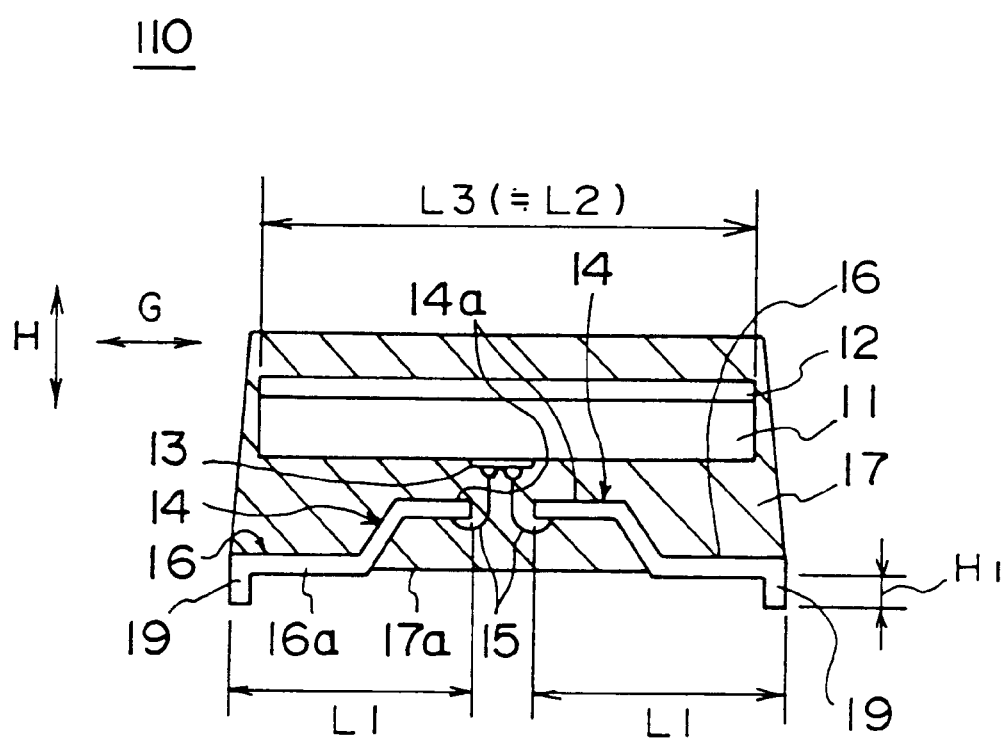
FIG. 22 is a cross sectional view showing a tenth embodiment of the semiconductor device according to the present invention.
Figure 23:
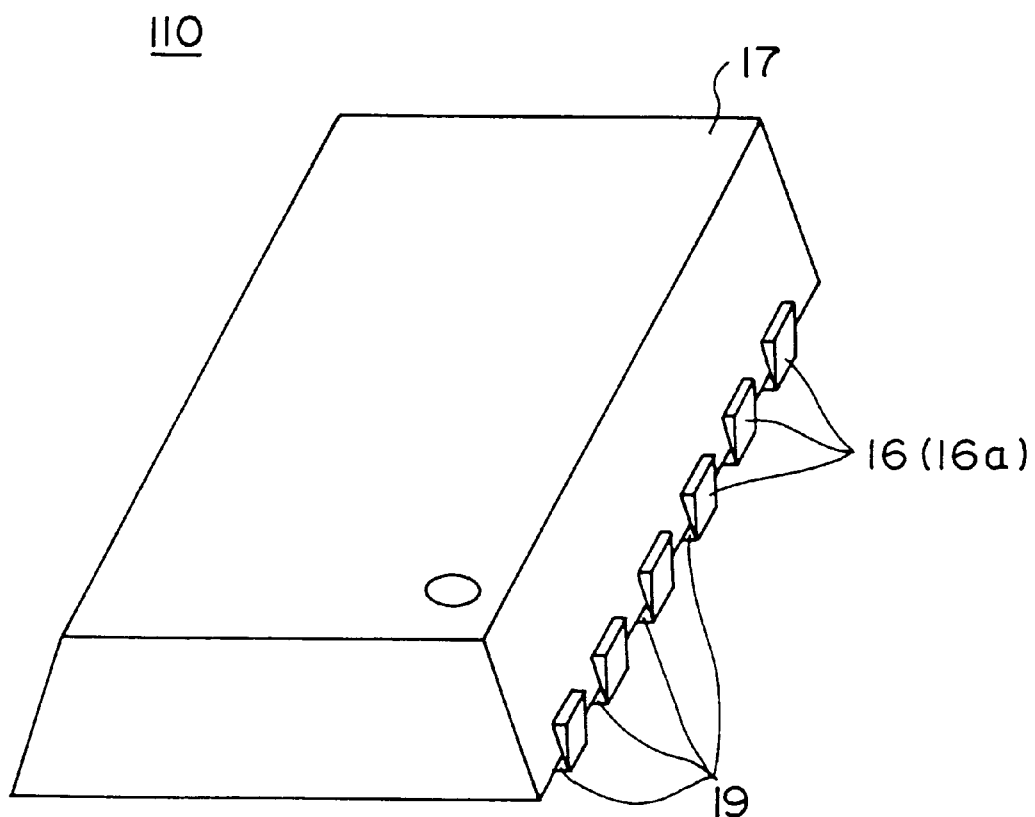
FIG. 23 is a perspective view showing the tenth embodiment of the semiconductor device.
Figure 24:
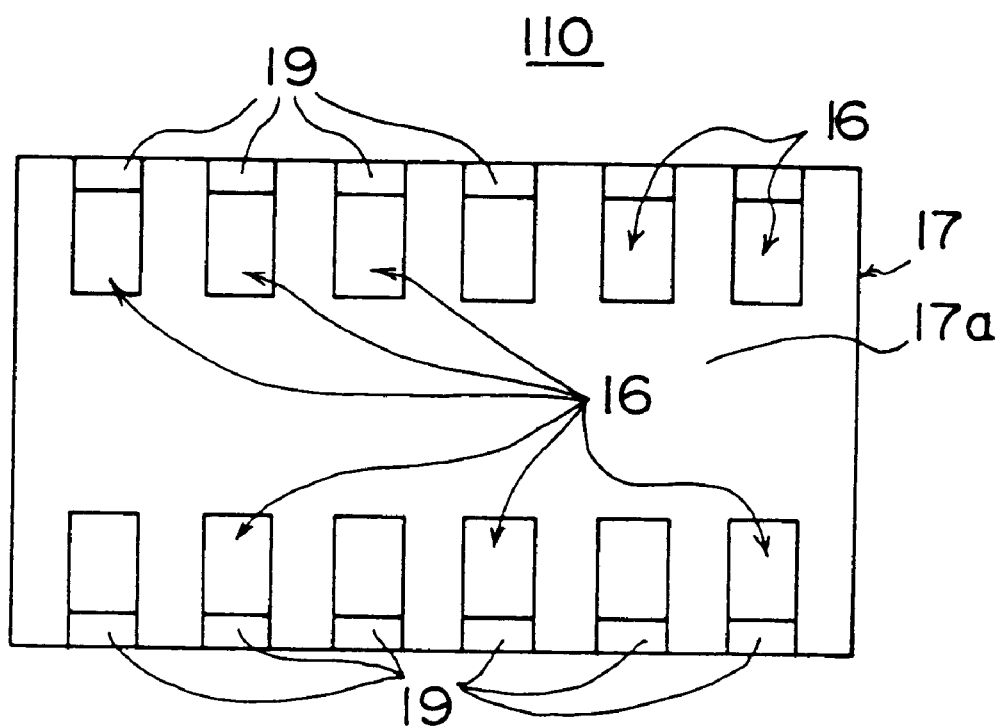
FIG. 24 is a bottom view showing the tenth embodiment of the semiconductor device.

A description will be given of a tenth embodiment of the semiconductor device according to the present invention, by referring to FIGS. 22 through 24. FIG. 22 is a cross sectional view showing the tenth embodiment of the semiconductor device according to the present invention. FIG. 23 is a perspective view showing the external appearance of the tenth embodiment of the semiconductor device. In addition, FIG. 24 is a bottom view of the tenth embodiment of the semiconductor device. In FIGS. 22 through 24, those parts which are the same as those corresponding parts in FIGS. 3A and 3B are designated by the same reference numerals.

A semiconductor device 110 shown in FIG. 22 includes a semiconductor chip 11 which is mounted on a stage 12. For example, this semiconductor chip 11 is a memory chip which is relatively large. In addition, electrode pads 13 of the semiconductor chip 11 are arranged at the central part on the top surface of the semiconductor chip 11 along the longitudinal direction thereof.

One end 14a of each of a plurality of leads 14 is connected to the electrode pad 13 of the semiconductor chip 11 via a wire 15. In addition, each lead 14 is bent with respect to a direction H which is taken along the height of the semiconductor device 110, and has an approximate Z-shape when viewed from the side as shown in FIG. 22. Accordingly, each lead 14 first extends horizontally from the end 14a in FIG. 22, thereafter extends down, and then extends horizontally again at the other end. As will be described later, the end of the lead 14 opposite to the end 14a forms an external terminal 16.

A resin package 17 encapsulates the semiconductor chip 11, the wires 15 and the plurality of leads 14. In the plan view, this package 17 has a size which is approximately the same as or, slightly larger than, the area of the semiconductor chip 11. In other words, the package 17 is considerably small compared to the conventional package.

Figure 25A:
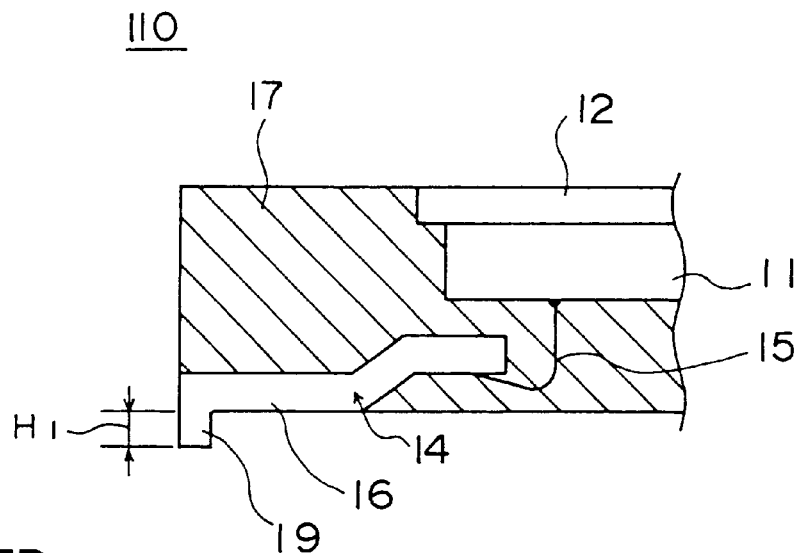
FIGS. 25A and 25B respectively are cross sectional views for explaining the tenth embodiment of the semiconductor device and a first embodiment of a semiconductor device mounting structure according to the present invention.
Figure 25B:
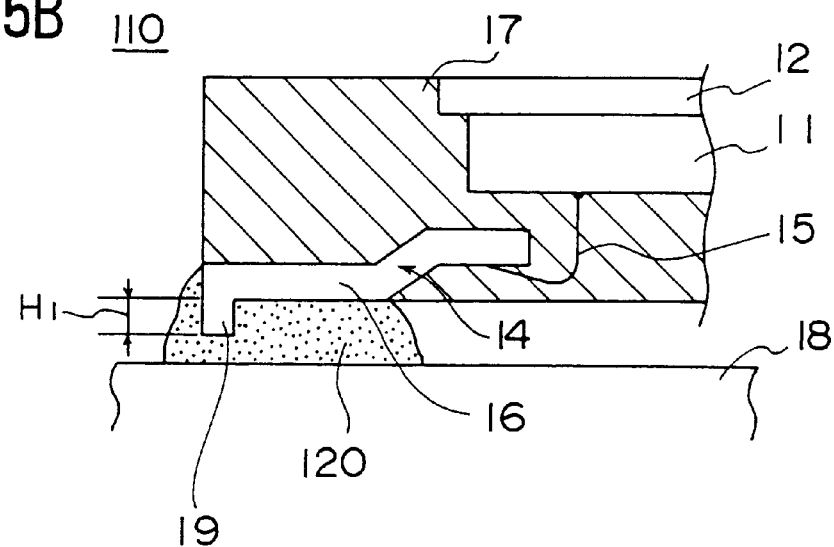

A bottom portion (or bottom surface) 16a of the external terminal 16 of the lead 14 is exposed at a bottom surface 17a of the package 17. In addition, a lead projection 19 is formed on the external terminal 16 so that the lead projection 19 projects from the bottom surface 17a of the package 17. Hence, the semiconductor device 110 is mounted on a circuit substrate 18 which is shown in FIG. 25B by soldering the external terminals 16 having the lead projections 19 to the circuit substrate 18.

As a method of exposing the bottom portion 16a of the external terminal 16 with respect to the bottom surface 17a of the package 17, it is for example possible to contact the external terminal 16 directly to a die which is used to mold the resin to form the package 17, so that the bottom portion 16a will not be covered by the resin. Hence, it is relatively easy to expose the bottom portion 16a with respect to the bottom surface 17a of the package 17.

In addition, as a method of making the lead projection 19 project from the bottom surface 17a of the package 17, it is for example possible to provide the lead 14 so that a portion of the lead 14 projects sidewards from the package 17 in a state where the package 17 is formed, and to bend the sidewardly projecting portion of the lead 14 to form the lead projection 19.

When the lead projection 19 is formed by such a method, the lead projection 19 is formed integrally on the lead 14. As a result, there is no need to provide an independent part to form the lead projection 19, and the cost of the semiconductor device 110 can be reduced. Furthermore, the die which is used to form the package 17 may be similar to that used to form the conventional semiconductor device, and the cost of the die can be reduced.

Next, a description will be given of the structural features of the semiconductor device 110. As shown in FIG. 22, approximately all portions of the plurality of leads 14 within the package 17 overlap the semiconductor chip 11 when viewed from the top of the semiconductor device 110 in a vertical direction H taken along the height of the semiconductor device 110. In other words, the leads 14 and the semiconductor chip 11 overlap within the package 17 in the plan view of the semiconductor device 110.

If a length of each lead 14 in a horizontal direction G is denoted by L1, an amount of overlap L2 between the lead 14 and the semiconductor chip 11 can be described by L2≈2·L1. In addition, since the area of the package 17 and the area of the semiconductor chip 11 in the plan view are approximately the same, the length of the semiconductor device 10 in the horizontal direction G becomes approximately L3 if a length of the semiconductor chip 11 in the horizontal direction G is denoted by L3.

On the other hand, according to the conventional semiconductor device 1 shown in FIGS. 19 and 20, a length L4 of the package 3 is approximately a sum of the length L3 of the semiconductor chip 11, the length L1 of the lead 4 on one side, and the length of the lead 4 on the other side of the semiconductor chip 2. In other words, L4=L3+2·L1.

Therefore, it may be seen that the size of the semiconductor device 110 of this embodiment can be reduced by the overlap L2 compared to the size of the conventional semiconductor device 1. In addition, because the semiconductor device 110 is considerably small compared to the conventional semiconductor device 1, it is possible to improve the mounting efficiency of the semiconductor device 110 with respect to the circuit substrate 18, and thereby reduce the size and improve the performance of the equipments which are mounted with the semiconductor device 110.

Next, a description will be given of a first embodiment of a semiconductor device mounting structure for mounting the tenth embodiment of the semiconductor device on a circuit substrate, by referring to FIGS. 25A and 25B. FIG. 25A is a cross sectional view showing a vicinity of the lead projection 19 of the semiconductor device 110 on an enlarged scale, and FIG. 25B is a cross sectional view showing the semiconductor device 110 in a state mounted on the circuit substrate 18.

For the sake of convenience, FIGS. 25A and 25B show a case where the amount of overlap between the semiconductor chip 11 and the lead 14 is relatively small. In addition, the stage 12 of the semiconductor device 110 is exposed from the package 17 so that the heat radiation efficiency is improved.

As described above, the semiconductor device 110 is provided with the lead projection 19 which is formed on the external terminal 16 and projects from the bottom surface 17a of the package 17. By providing this lead projection 19, it is possible to mount the semiconductor device 110 with respect to the circuit substrate 18 with a higher reliability compared to the case where the conventional semiconductor device 1 shown in FIGS. 19 and 20 and not provided with the lead projection 19 is mounted on the circuit substrate 8. The reasons for the higher reliability will be described hereunder.

In the case of the conventional semiconductor device 1 which is not provided with the lead projection 19, there is no means provided to support the semiconductor device 1 in a state separated from the circuit substrate 8. For this reason, as shown in FIG. 19, a thickness t of the solder 9 which is interposed between the semiconductor device 1 and the circuit substrate 8 and connects the two is small.

On the other hand, according to the semiconductor device 110 of this embodiment, a projecting height $H_1$ of the lead projection 19 is secured as a minimum height of a solder (soft bonding material) 120 by providing the lead projection 19 on the external terminal 16 so as to project from the bottom surface 17a of the package 17. For this reason, it is possible to increase the thickness of the solder 120 which is arranged on the external terminal 16 compared to the conventional semiconductor device mounting structure by providing the lead projection 19.

The solder 120 has the function of bonding and connecting the semiconductor device 110 and the circuit substrate 18. In addition, since the solder 120 is a soft bonding material, the solder 120 also has the function of a stress absorbing member which is interposed between the semiconductor device 110 and the circuit substrate 18. In other words, because the solder 120 is a soft metal material, the solder 120 can be deformed and absorb the thermal stress which is generated due to the difference between the coefficients of linear thermal expansion of the semiconductor device 110 and the circuit substrate 18.

Particularly since the melting point of the solder 120 is relatively low, the solder 120 softens during the thermal process when the thermal stress becomes a problem, and the softened solder 120 can effectively absorb the thermal stress generated during the thermal process. On the other hand, the solder 120 is used as a bonding material for bonding and connecting the semiconductor device 110 to the circuit substrate 18, and has a satisfactory bonding characteristic. Therefore, it is possible to relieve the thermal stress and to improve the bonding characteristic by using the solder 120 as the soft bonding material.

The stress absorbing function of the solder 120 increases as the thickness of the solder 120 increases. Accordingly, by providing the lead projection 19 and increasing the thickness of the solder 120 to increase the stress absorbing function of the solder 120, it is possible to positively absorb the thermal stress by the solder 120 even when the thermal stress is generated due to the difference between the coefficients of linear thermal expansion of the semiconductor device 110 and the circuit substrate 18. As a result, it is possible to prevent damage to the connecting portions between the semiconductor device 110 and the circuit substrate 18 and to prevent cracks from being formed in the package 17, and the mounting characteristic and the reliability of the semiconductor device 110 are improved.

Figure 26:
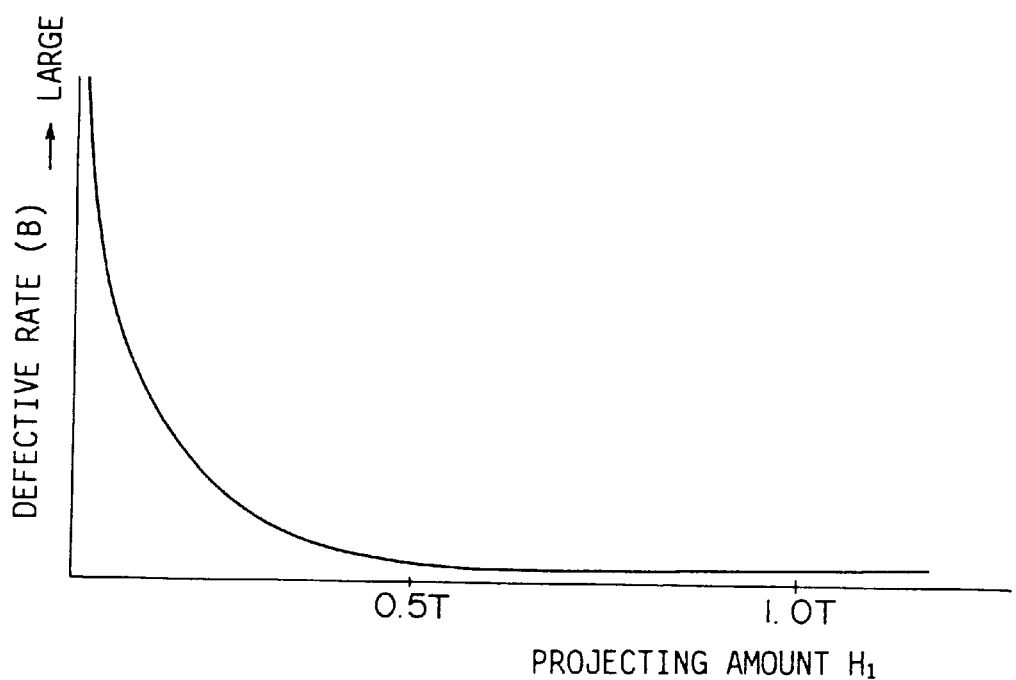
FIG. 26 is a diagram for explaining a relationship of a rate of defects generated at the time of mounting and a solder thickness.

A description will be given of a relationship of a rate of defects generated at the time of mounting the semiconductor device 110 on the circuit substrate 18 and the projecting amount $H_1$ of the lead projection 19 from the bottom surface 17a of the package 17, by referring to FIG. 26. In FIG. 26, the ordinate indicates the rate of detects (hereinafter referred to as the defective rate B) generated at the time of the mounting of the semiconductor device 110, and the abscissa indicates the projecting amount $H_1$ of the lead projection 19 from the bottom surface 17a of the package 17.

The defective rate B at the time of mounting the semiconductor device 110 is defined as a ratio of a number n of semiconductor devices 110 having defective bonding with respect to a number N of semiconductor devices 110 which have the lead projections 19 of identical height when the N semiconductor device 110 are mounted on the circuit substrates 18, that is, B=(n/N)·100. In addition, the projecting amount $H_1$ of the lead projection 19 from the bottom surface 17a of the package 17 is indicated using a thickness T of the lead 14 as a reference.

As clearly seen from FIG. 26, the defective rate B rapidly decreases when $H_1 \geq 0.4 \cdot T$. The reason for this rapid decrease of the defective rate B is because the thickness of the solder 120 becomes large when the projecting amount $H_1$ becomes greater than or equal to 0.4·T, and the thermal stress generated between the semiconductor device 110 and the circuit substrate 18 is effectively absorbed by the solder 120. Hence, by setting the projecting amount $H_1$ of the lead projection 19 from the bottom surface 17a of the package 17 to 0.4·T or greater, the damage to the connecting portion between the semiconductor device 110 and the circuit substrate 18 is prevented, and cracks are prevented from being formed in the package 17, thereby enabling bonding of the semiconductor device 110 and the circuit substrate 18 with a high reliability.

On the other hand, when the projecting amount $H_1$ of the lead projection 19 from the bottom surface 17a of the package 17 becomes too large, the length of the solder 120 in the direction H in FIG. 22 becomes too large and the mechanical strength deteriorates. Accordingly, the bonding strength between the semiconductor device 110 and the circuit substrate 18 deteriorates when the projecting amount $H_1$ of the lead projection 19 is too large, and in such a case, the reliability at the time of mounting the semiconductor device 110 on the circuit substrate 18 deteriorates. In order for the solder 120 to bond and connect the semiconductor device 110 and the circuit substrate 18 with a high reliability, the projecting amount $H_1$ of the lead projection 19 is desirably less than or equal to 3.0·T ($H_1 \leq 3.0 \cdot T$).

From the above results, it is desirable that the projecting amount $H_1$ of the lead projection 19 from the bottom surface 17a of the package 17 is set to satisfy the relation $0.4 \cdot T \leq H_1 \leq 3.0 \cdot T$. By setting the projecting amount $H_1$ to satisfy this relationship, it becomes possible for the solder 120 to effectively absorb the thermal stress that is generated due to the difference between the coefficients of linear thermal expansion of the semiconductor device 110 and the circuit substrate 18, and it also becomes possible to secure a predetermined bonding strength which is sufficient to bond and connect the semiconductor device 110 and the circuit substrate 18. As a result, it becomes possible to improve the mounting characteristic and the reliability of the semiconductor device 110.

In the case of the semiconductor device 110 having the chip-size package structure, the thickness R of the lead 14 is approximately 50 μm. Accordingly, when this value of the thickness T is substituted into the above described relation $0.4 \cdot T \leq H_1 \leq 3.0 \cdot T$, a relation $20 \leq H_1 \leq 150$ is obtained. In other words, the mounting characteristic and the reliability of the semiconductor device 110 can be improved by setting the projecting amount $H_1$ of the lead projection 19 from the bottom surface 17a of the package 17 in a range of approximately 20 μm to 150 μm.

Figure 27A:
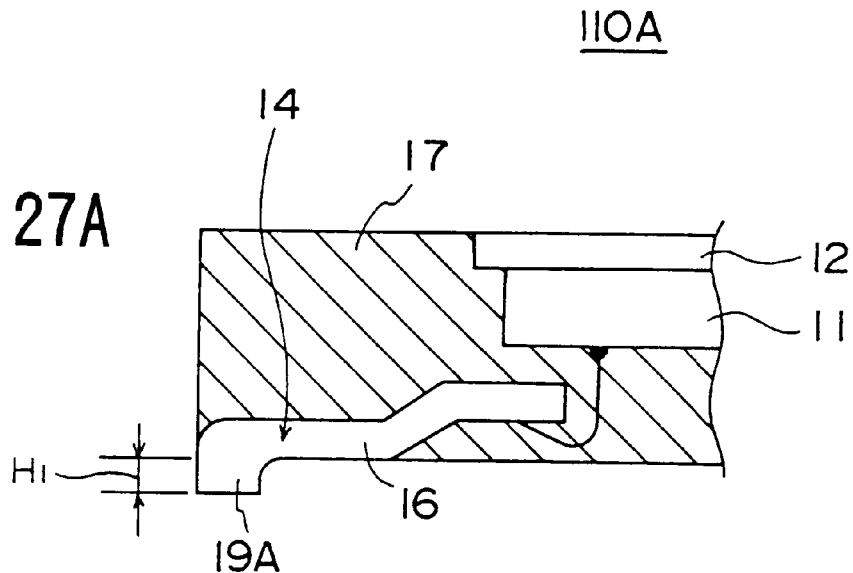
FIGS. 27A and 27B respectively are cross sectional views for explaining an eleventh embodiment of the semiconductor device according to the present invention and a second embodiment of the semiconductor device mounting structure according to the present invention.
Figure 27B:
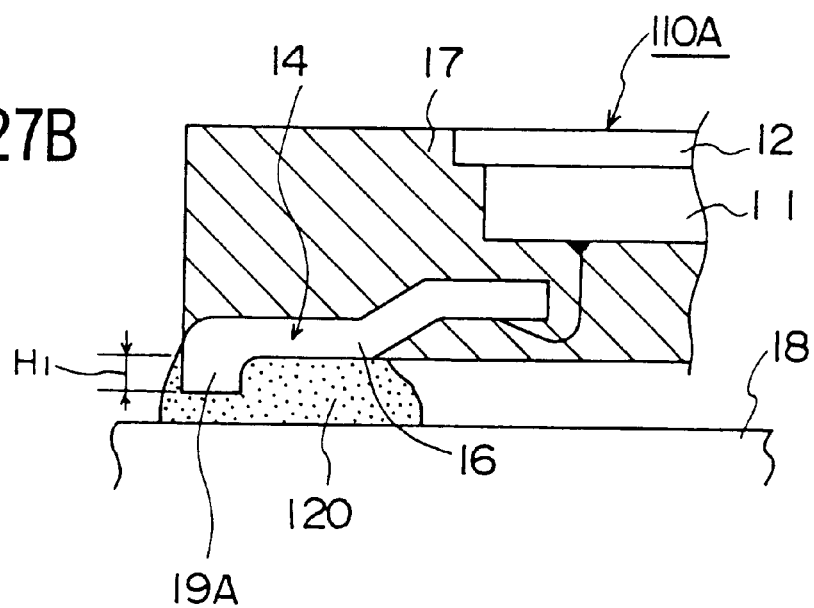

Next, a description will be given of an eleventh embodiment of the semiconductor device according to the present invention. FIGS. 27A and 27B respectively are cross sectional views for explaining the eleventh embodiment of the semiconductor device and a second embodiment of the semiconductor device mounting structure according to the present invention. More particularly, FIG. 27A is a cross sectional view showing a vicinity of a lead projection 19A of a semiconductor device 110A on an enlarged scale, and FIG. 27B is a cross sectional view showing the semiconductor device 110A in a state mounted on the circuit substrate 18. In FIGS. 27A and 27B, those parts which are the same as those corresponding parts in FIGS. 25A and 25B are designated by the same reference numerals, and a description thereof will be omitted.

In the tenth embodiment of the semiconductor device, the lead projection 19 is formed by bending the portion of the lead 14 projecting from the package 17 of the semiconductor device 110 after the package 17 is formed. However, if an excessively large bending force is applied on the lead 14, there is a possibility of the external terminal 16 separating from the package 17.

On the other hand, in this eleventh embodiment of the semiconductor device, the tip end portion of the external terminal 16 of the semiconductor device 110A is bent simultaneously as the forming of the lead 14, so as to form the lead projection 19A. According to this embodiment, the lead projection 19A is already formed when the package 17 is formed, and the external terminal 16 will not separate from the package 17. In addition, since the lead projection 19A is formed simultaneously as the processing of the lead 14, it is possible to easily and efficiently form the lead projection 19A.

As in the case of the tenth embodiment, a projecting amount $H_1$ of the lead projection 19A from the bottom surface 17a of the package 17 is also set to satisfy a condition $0.4 \cdot T \leq H_1 \leq 3.0 \cdot T$, where T denotes the thickness of the lead 14. More particularly, the projecting amount $H_1$ of the lead projection 19A is desirably set in a range of approximately 20 µm to 150 µm.

Accordingly, similarly to the case where the semiconductor device 110 described above is mounted on the circuit substrate 18, it is possible to effectively absorb the thermal stress that is generated due to the difference between the coefficients of thermal expansion of the semiconductor device 110A and the circuit substrate 18 by the solder 120. In addition, the solder 120 can have the predetermined bonding strength which is sufficient to bond and connect the semiconductor device 110A and the circuit substrate 18. Hence, the mounting characteristic and the reliability of the semiconductor device 110A are improved.

According to the method employed in this embodiment, the lead projection 19A is formed before forming the package 17. For this reason, if the package 17 were formed by simply using a die similar to that used conventionally, the external terminal 16 and the lead projection 19A would be covered by the resin.

In order to prevent the external terminal 16 and the lead projection 19A from being covered by the resin and to expose the exposed portion 16a of the external terminal 16 at the bottom surface 17a of the package 17, a recess is formed in the die at a position confronting the lead projection 19A. When such a die is used, the lead projection 19A is located within the recess of the die when the resin is molded, and the exposed portion 16a of the external terminal 16 makes direct contact with the die. Consequently, the exposed portion 16a and the lead projection 19A can be exposed from the package 17.

Figure 28A:
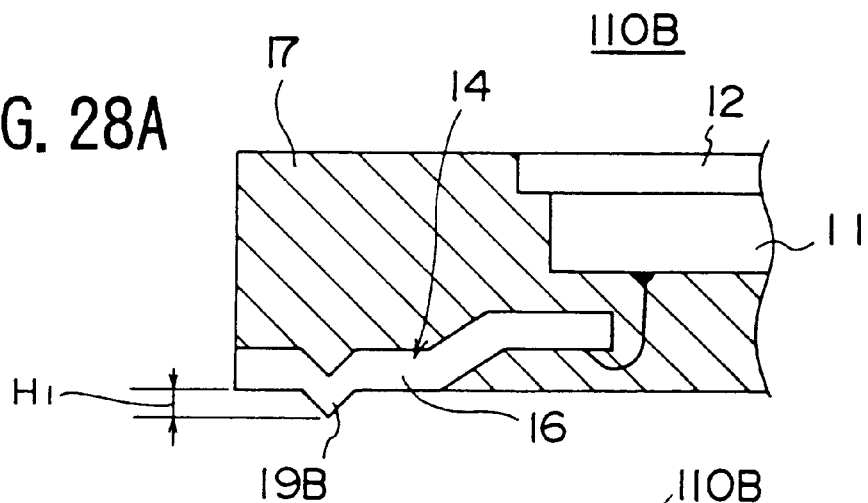
FIGS. 28A and 28B respectively are cross sectional views for explaining a twelfth embodiment of the semiconductor device according to the present invention and a third embodiment of the semiconductor device mounting structure according to the present invention.
Figure 28B:
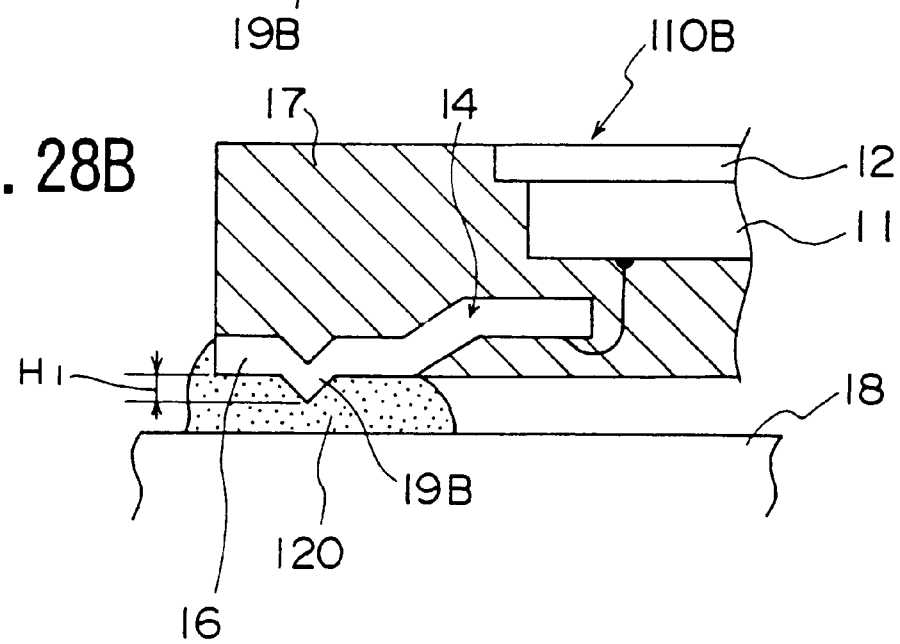

Next, a description will be given of a twelfth embodiment of the semiconductor device according to the present invention. FIGS. 28A and 28B respectively are cross sectional views for explaining the twelfth embodiment of the semiconductor device and a third embodiment of the semiconductor device mounting structure according to the present invention. More particularly, FIG. 28A is a cross sectional view showing a vicinity of a lead projection 19B of a semiconductor device 110B on an enlarged scale, and FIG. 28B is a cross sectional view showing the semiconductor device 110B in a state mounted on the circuit substrate 18. In FIGS. 28A and 28B, those parts which are the same as those corresponding parts in FIGS. 25A and 25B are designated by the same reference numerals, and a description thereof will be omitted.

In the tenth and eleventh embodiments of the semiconductor device, the lead projections 19 and 19A are respectively formed by bending the portions of the leads 14 projecting from the packages 17 of the semiconductor devices 110 and 110A, so that the lead projections 19 and 19A project from the bottom surfaces 17a of the packages 17. On the other hand, in this twelfth embodiment of the semiconductor device, a press-working is carried out with respect to the external terminal 16 so as to form the lead projection 19B.

By using such a method of forming the lead projection 19B, the lead projection 19B is already formed when the package 17 is formed, and the external lead 16 will not separate from the package 17, similarly as in the case of the eleventh embodiment. In addition, the lead projection 19B can be formed simultaneously as the processing of the lead 14, and it is possible to easily and efficiently form the lead projection 19B.

As in the case of the eleventh embodiment, a projecting amount $H_1$ of the lead projection 19B from the bottom surface 17a of the package 17 is also set to satisfy a condition $0.4 \cdot T \leq H_1 \leq 3.0 \cdot T$, where T denotes the thickness of the lead 14. More particularly, the projecting amount $H_1$ of the lead projection 19B is desirably set in a range of approximately 20 µm to 150 µm.

Accordingly, similarly to the case where the semiconductor devices 110 and 110A described above are mounted on the circuit substrates 18, it is possible to effectively absorb the thermal stress that is generated due to the difference between the coefficients of thermal expansion of the semiconductor device 110B and the circuit substrate 18 by the solder 120. In addition, the solder 120 can have the predetermined bonding strength which is sufficient to bond and connect the semiconductor device 110B and the circuit substrate 18. Hence, the mounting characteristic and the reliability of the semiconductor device 110B are improved.

Figure 29A:
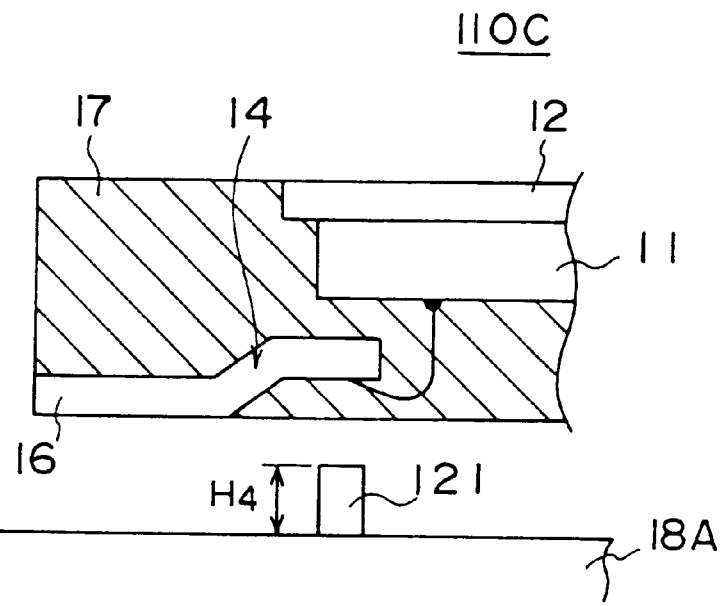
FIGS. 29A and 29B respectively are cross sectional views for explaining a thirteenth embodiment of the semiconductor device according to the present invention and a fourth embodiment of the semiconductor device mounting structure according to the present invention.
Figure 29B:
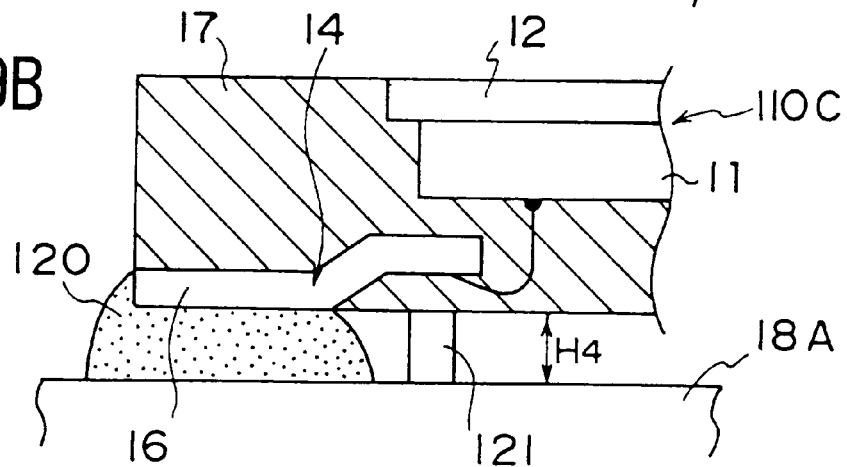

Next, a description will be given of a thirteenth embodiment of the semiconductor device according to the present invention. FIGS. 29A and 29B respectively are cross sectional views for explaining the thirteenth embodiment of the semiconductor device and a fourth embodiment of the semiconductor device mounting structure according to the present invention. More particularly, FIG. 29A is a cross sectional view showing a vicinity of the external terminal 16 of a semiconductor device 110C on an enlarged scale, and FIG. 29B is a cross sectional view showing the semiconductor device 110C in a state mounted on a circuit substrate 18A. In FIGS. 29A and 29B, those parts which are the same as those corresponding parts in FIGS. 25A and 25B are designated by the same reference numerals, and a description thereof will be omitted.

In the tenth through twelfth embodiments of the semiconductor device, the lead projections 19, 19A and 19B are formed on the leads 14 of the semiconductor devices 110, 110A and 110B, so as to increase the thickness of the solder 120 when the semiconductor devices 110, 110A and 110B are mounted on the circuit substrates 18. On the other hand, in this thirteenth embodiment of the semiconductor device, no lead projection is provided on the semiconductor device 110C, and instead, a spader 121 is formed on the circuit substrate 18A.

By providing the spacer 121 on the circuit substrate 18A, it becomes possible to support the semiconductor device 110C in a state where the semiconductor device 110c is separated from the surface of the circuit substrate 18A. For this reason, the solder 120 can be arranged at the separating portion or gap formed between the semiconductor device 110C and the circuit substrate 18A.

A projecting amount $H_4$ of the spacer 121 from the surface of the circuit substrate 18A is set to satisfy a condition $0.4 \cdot T \leq H_4 \leq 3.0 \cdot T$, where T denotes the thickness of the lead 14. More particularly, the projecting amount $H_4$ of the spacer 121 is desirably set in a range of approximately 20 µm to 150 µm.

When the spacer 121 is formed on the circuit substrate 18A, the height $H_4$ of the spacer 121 is secured as the minimum height of the solder 120. Thus, the thickness of the solder 120 can be increased by providing the spacer 121.

Accordingly, similarly to the case where the semiconductor devices 110, 110A and 110B described above are mounted on the circuit substrates 18, it is possible to effectively absorb the thermal stress that is generated due to the difference between the coefficients of thermal expansion of the semiconductor device 110c and the circuit substrate 18A by the solder 120. In addition, the solder 120 can have the predetermined bonding strength which is sufficient to bond and connect the semiconductor device 110C and the circuit substrate 18A. Hence, the mounting characteristic and the reliability of the semiconductor device 110C are improved.

Figure 30A:
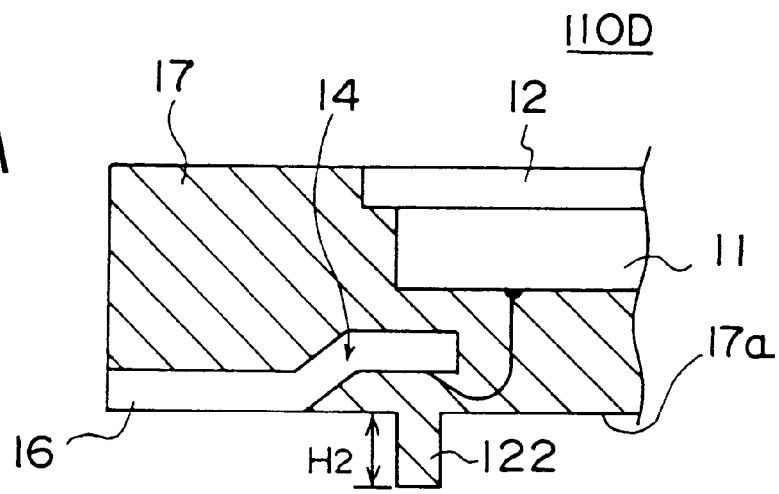
FIGS. 30A and 30B respectively are cross sectional views for explaining a fourteenth embodiment of the semiconductor device according to the present invention and a fifth embodiment of the semiconductor device mounting structure according to the present invention.
Figure 30B:
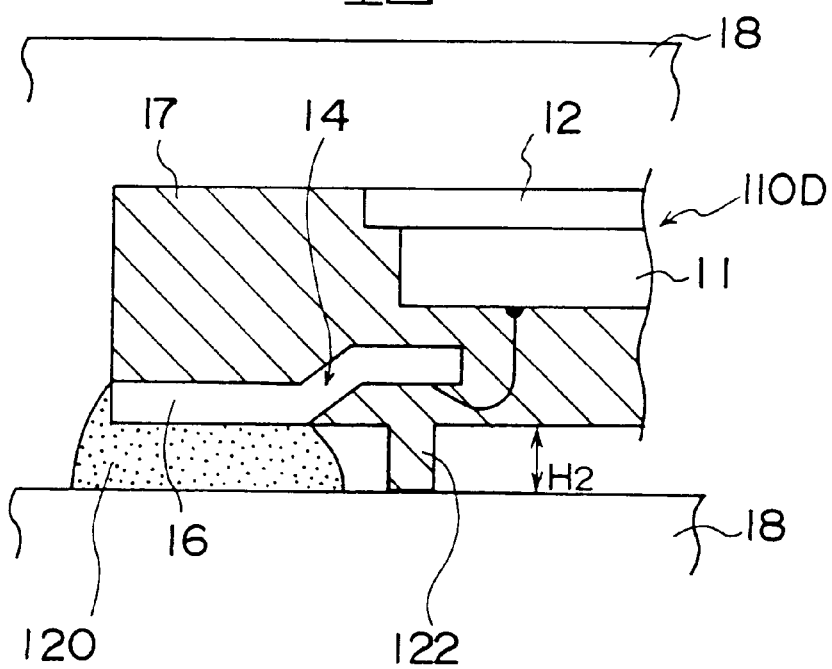

Next, a description will be given of a fourteenth embodiment of the semiconductor device according to the present invention. FIGS. 30A and 30B respectively are cross sectional views for explaining the fourteenth embodiment of the semiconductor device and a fifth embodiment of the semiconductor device mounting structure according to the present invention. More particularly, FIG. 30A is a cross sectional view showing a vicinity of the external terminal 16 of a semiconductor device 110D on an enlarged scale, and FIG. 30B is a cross sectional view showing the semiconductor device 110D in a state mounted on the circuit substrate 18. In FIGS. 30A and 30B, those parts which are the same as those corresponding parts in FIGS. 25A and 25B are designated by the same reference numerals, and a description thereof will be omitted.

In the thirteenth embodiment of the semiconductor device and the fourth embodiment of the semiconductor device mounting structure, the spacer 121 is provided on the circuit substrate 18A so as to increase the thickness of the solder 120 when the semiconductor device 110C is mounted on the circuit substrate 18A. On the other hand, in this fourteenth embodiment of the semiconductor device, the semiconductor device 110D is provided with a package projection 122 which projects downwards from the bottom surface 17a of the package 17.

The package projection 122 is formed simultaneously as the forming of the package 17, and thus, the package projection 122 is formed integrally on the package 17. For this reason, the package projection 122 can be formed with ease, and the semiconductor device 110D can be produced without increasing the number of production steps.

By providing the package projection 122 on the package 17, it becomes possible to support the semiconductor device 110D in a state where the semiconductor device 110D is separated from the surface of the circuit substrate 18. Hence, the solder 120 can be arranged at the separating portion or gap formed between the semiconductor device 110D and the circuit substrate 18.

A projecting amount $H_2$ of the package projection 122 from the surface of the circuit substrate 18A is set to satisfy a condition $0.4 \cdot T \leq H_2 \leq 3.0 \cdot T$, where T denotes the thickness of the lead 14. More particularly, the projecting amount $H_2$ of the package projection 122 is desirably set in a range of approximately 20 µm to 150 µm.

When the package projection 122 is formed on the package 17, the height $H_2$ of the package projection 122 is secured as the minimum height of the solder 120. Thus, the thickness of the solder 120 can be increased by providing the package projection 122.

Accordingly, similarly to the case where the semiconductor devices 110, 110A, 110B and 110C described above are mounted on the circuit substrates 18 and 18A, it is possible to effectively absorb the thermal stress that is generated due to the difference between the coefficients of thermal expansion of the semiconductor device 110D and the circuit substrate 18 by the solder 120. In addition, the solder 120 can have the predetermined bonding strength which is sufficient to bond and connect the semiconductor device 110D and the circuit substrate 18. Hence, the mounting characteristic and the reliability of the semiconductor device 110D are improved.

Figure 31A:
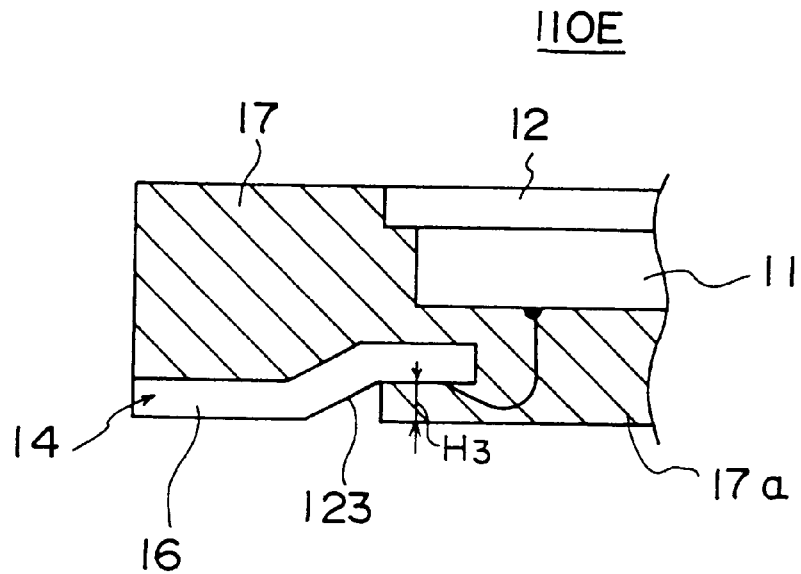
FIGS. 31A and 31B respectively are cross sectional views for explaining a fifteenth embodiment of the semiconductor device according to the present invention and a sixth embodiment of the semiconductor device mounting structure according to the present invention.
Figure 31B:
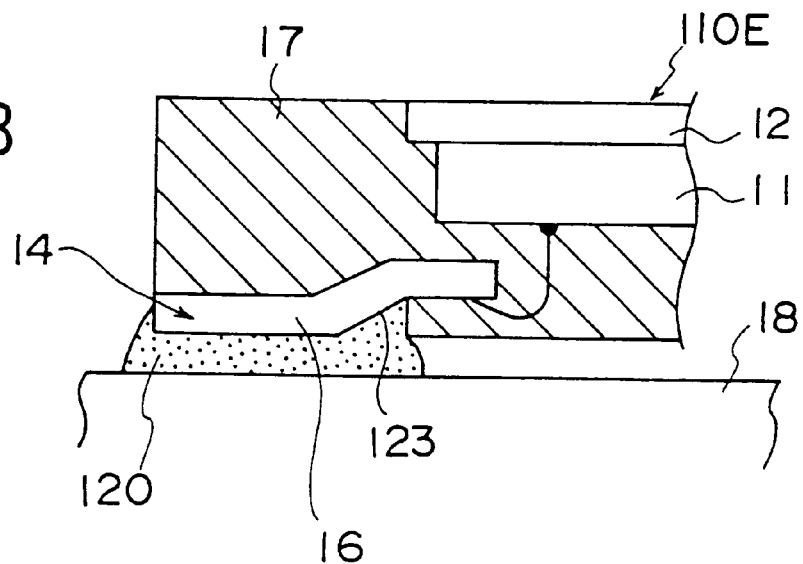

Next, a description will be given of a fifteenth embodiment of the semiconductor device according to the present invention. FIGS. 31A and 31B respectively are cross sectional views for explaining the fifteenth embodiment of the semiconductor device and a sixth embodiment of the semiconductor device mounting structure according to the present invention. More particularly, FIG. 31A is a cross sectional view showing a vicinity of the external terminal 16 of a semiconductor device 110E on an enlarged scale, and FIG. 31B is a cross sectional view showing the semiconductor device 110E in a state mounted on the circuit substrate 18. In FIGS. 31A and 31B, those parts which are the same as those corresponding parts in FIGS. 25A and 25B are designated by the same reference numerals, and a description thereof will be omitted.

In the tenth through twelfth embodiments of the semiconductor device, the lead projections 19, 19A and 19B are formed on the leads 14 of the semiconductor devices 110, 110A and 110B, so as to increase the thickness of the solder 120 when the semiconductor devices 110, 110A and 110B are mounted on the circuit substrates 18. On the other hand, in this fifteenth embodiment of the semiconductor device, a lead recess 123 is formed in the lead 14, so as to increase the thickness of the solder 120 when the semiconductor device 110E is mounted on the circuit substrate 18.

In this embodiment of the semiconductor device, the portion of the lead 14 that is bent in an approximate Z-shape is used to form the lead recess 123. In addition, the resin forming the package 17 is not provided at the portion where the lead recess 123 is formed. In other words, the lead recess 123 is exposed from the package 17.

By forming the lead recess 123 in the lead 14 and exposing this lead recess 123 from the package 17, the lead recess 123 confronts and is separated from the circuit substrate 18 in a state where the semiconductor device 110E is mounted on the circuit substrate 18, and the solder 120 can be arranged at this portion where the lead recess 123 confronts and is separated from the circuit substrate 18.

A depth $H_3$ of this lead recess 123 from the bottom surface 17a of the package 17 is set to satisfy a condition $0.4 \cdot T \leq H_3 \leq 3.0 \cdot T$, where T denotes the thickness of the lead 14. More particularly, the depth amount $H_3$ of the lead recess 123 is desirably set in a range of approximately 20 µm to 150 µm.

When the lead recess 123 is formed in the lead 14, the depth $H_3$ of the lead recess 123 is secured as the minimum height of the solder 120. Thus, the thickness of the solder 120 can be increased by providing the lead recess 123.

Accordingly, similarly to the case where the semiconductor devices 110, 110A, 110B, 110C and 110D described above are mounted on the circuit substrates 18 and 18A, it is possible to effectively absorb the thermal stress that is generated due to the difference between the coefficients of thermal expansion of the semiconductor device 110E and the circuit substrate 18 by the solder 120. In addition, the solder 120 can have the predetermined bonding strength which is sufficient to bond and connect the semiconductor device 110E and the circuit substrate 18. Hence, the mounting characteristic and the reliability of the semiconductor device 110E are improved.

Figure 32A:
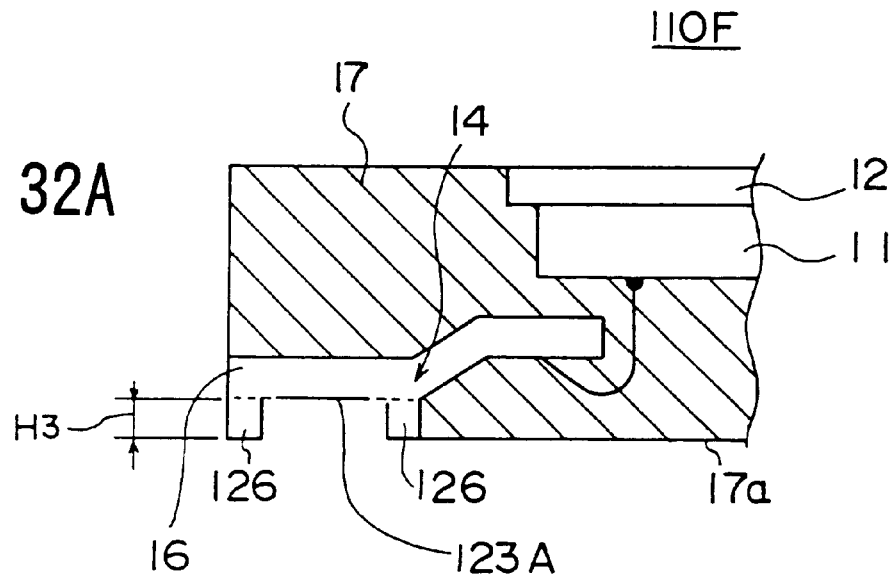
FIGS. 32A and 32B respectively are cross sectional views for explaining a sixteenth embodiment of the semiconductor device according to the present invention and a seventh embodiment of the semiconductor device mounting structure according to the present invention.
Figure 32B:
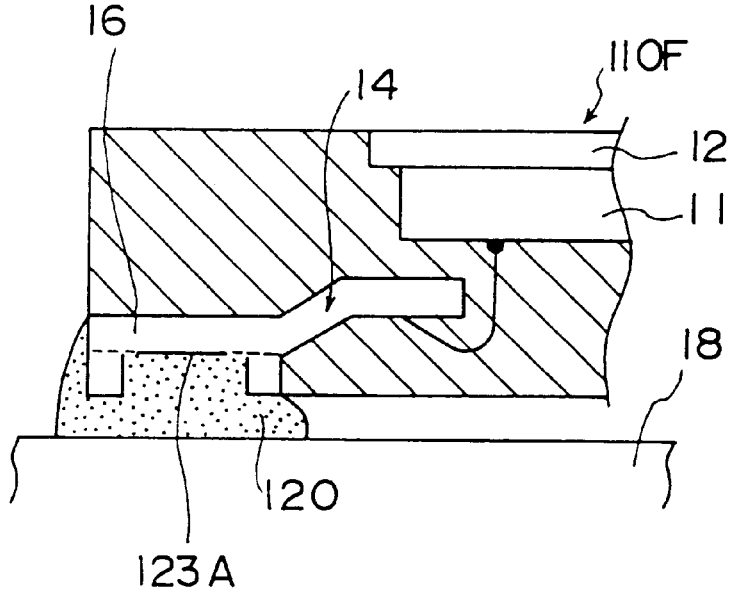

Next, a description will be given of a sixteenth embodiment of the semiconductor device according to the present invention. FIGS. 32A and 32B respectively are cross sectional views for explaining the sixteenth embodiment of the semiconductor device and a seventh embodiment of the semiconductor device mounting structure according to the present invention. More particularly, FIG. 32A is a cross sectional view showing a vicinity of the external terminal 16 of a semiconductor device 110F on an enlarged scale, and FIG. 32B is a cross sectional view showing the semiconductor device 110F in a state mounted on the circuit substrate 18. In FIGS. 32A and 32B, those parts which are the same as those corresponding parts in FIGS. 25A and 25B are designated by the same reference numerals, and a description thereof will be omitted.

In the fifteenth embodiment of the semiconductor device described above, the lead recess 123 is formed by using the Z-shaped bent portion of the lead 14, so as to increase the thickness of the solder 120 when the semiconductor device 110E is mounted on the circuit substrate 18. On the other hand, in this sixteenth embodiment of the semiconductor device, an etching process is carried out with respect to the lead 14 so as to form a lead recess 123A, so as to increase the thickness of the solder 120 when the semiconductor device 110F is mounted on the circuit substrate 18.

When forming the lead recess 123A, only the external terminal 16 is made to have a two-layer structure, that is, a stacked structure of two lead members. Thereafter, a portion of the two-layer structure corresponding to the lead recess 123A is removed by the etching process so that only portions 126 of the two-layer structure remain as shown in FIG. 32A. As a result, the lead recess 123A is formed in the two-layer structure, that is, the lead 14.

The etching process with respect to the lead 14 may be carried out after forming of the lead 14 or, after forming of the package 17. In addition, the lead recess 123A can be formed by a process other than the etching process, such as a press-working or a plastic-working.

By forming the lead recess 123A in the lead 14 and exposing this lead recess 123A from the package 17, the lead recess 123A confronts and is separated from the circuit substrate 18 in a state where the semiconductor device 110F is mounted on the circuit substrate 18, and the solder 120 can be arranged at this portion where the lead recess 123A confronts and is separated from the circuit substrate 18.

A depth $H_3$ of this lead recess 123A from the bottom surface 17a of the package 17 is set to satisfy a condition $0.4 \cdot T \leq H_3 \leq 3.0 \cdot T$, where T denotes the thickness of the lead 14. More particularly, the depth amount $H_3$ of the lead recess 123A is desirably set in a range of approximately 20 $\mu$m to 150 $\mu$m.

When the lead recess 123A is formed in the lead 14, the depth $H_3$ of the lead recess 123A is secured as the minimum height of the solder 120. Thus, the thickness of the solder 120 can be increased by providing the lead recess 123A.

Accordingly, similarly to the case where the semiconductor devices 110, 110A, 110B, 110C, 110D and 110E described above are mounted on the circuit substrates 18 and 18A, it is possible to effectively absorb the thermal stress that is generated due to the difference between the coefficients of thermal expansion of the semiconductor device 110F and the circuit substrate 18 by the solder 120. In addition, the solder 120 can have the predetermined bonding strength which is sufficient to bond and connect the semiconductor device 110F and the circuit substrate 18. Hence, the mounting characteristic and the reliability of the semiconductor device 110F are improved.

Figure 33A:
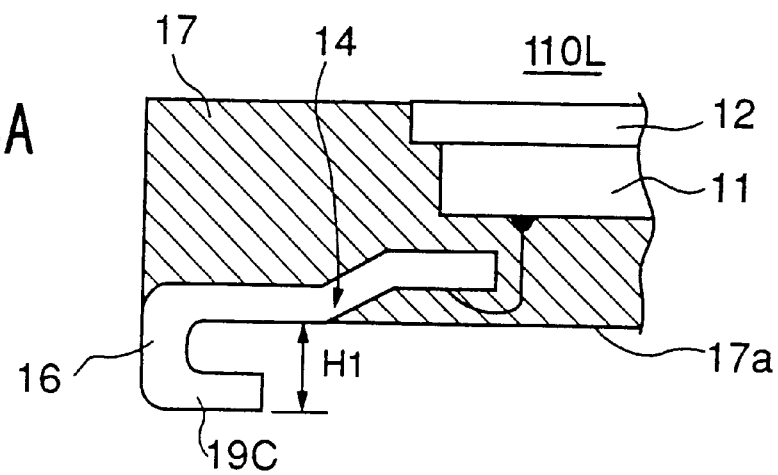
FIGS. 33A, 33B and 33C respectively are cross sectional views for explaining a seventeenth embodiment of the semiconductor device according to the present invention and an eighth embodiment of the semiconductor device mounting structure according to the present invention.
Figure 33B:
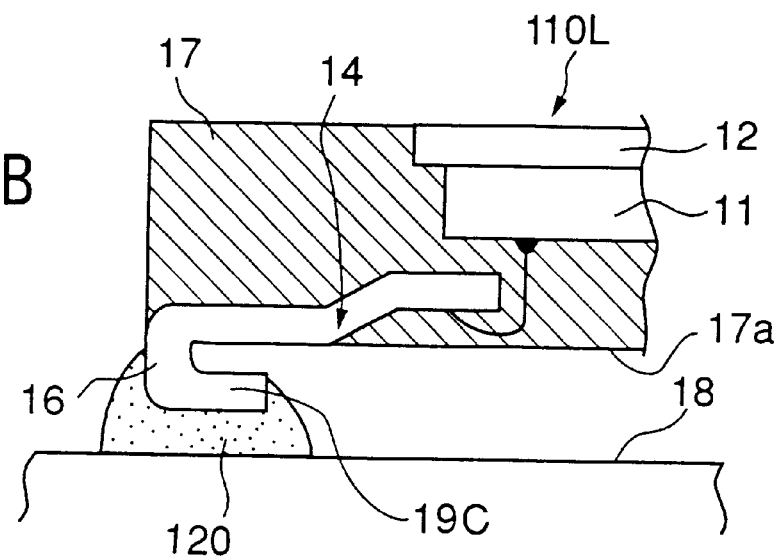
Figure 33C:
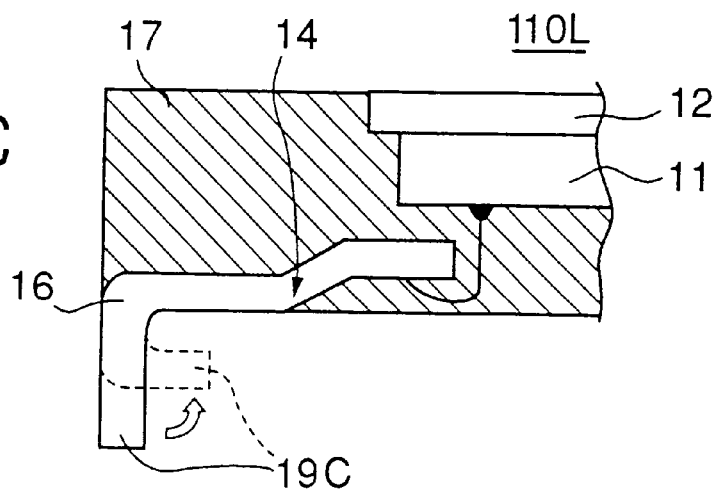

Next, a description will be given of a seventeenth embodiment of the semiconductor device according to the present invention. FIGS. 33A through 33C respectively are cross sectional views for explaining the seventeenth embodiment of the semiconductor device and an eighth embodiment of the semiconductor device mounting structure according to the present invention. More particularly, FIG. 33A is a cross sectional view showing a vicinity of a lead projection 19C of a semiconductor device 110L on an enlarged scale, FIG. 33B is a cross sectional view showing the semiconductor device 110L in a state mounted on the circuit substrate 18, and FIG. 33C is a cross sectional view for explaining a method of forming the lead projection 19C. In FIGS. 33A through 33C, those parts which are the same as those corresponding parts in FIGS. 25A and 25B are designated by the same reference numerals, and a description thereof will be omitted.

According to the semiconductor device 110L, the tip end portion of the external terminal 16 is bent in an approximate U-shape when farming the lead 14 as shown in FIG. 33C, so that the lead projection 19C confronts the bottom surface 17a of the package 17.

Because the lead projection 19C has the approximate U-shape, the lead projection 19C has a spring characteristic. In other words, a space is formed at a location, between the lead projection 19C and the bottom surface 17a of the package 17, where the soldering takes place. For this reason, even if a stress is applied on this location, the lead projection 19C can undergo resilient deformation within this space. Consequently, even if the thermal stress is applied on this location, the lead projection 19C undergoes resilient deformation and absorbs the thermal stress, and the generation of cracks in the package 17 is effectively prevented. Accordingly, it is possible to improve both the mounting characteristic and reliability of the semiconductor device 110L.

Next, a description will be given of the seventeenth embodiment of the semiconductor device.

Figure 34:
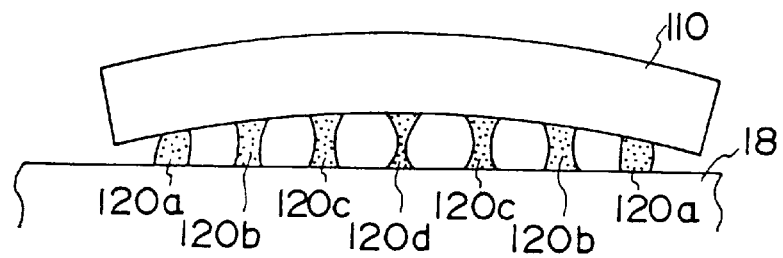
FIG. 34 is a diagram for explaining the semiconductor device mounting structure when the semiconductor device is warped.
Figure 35:
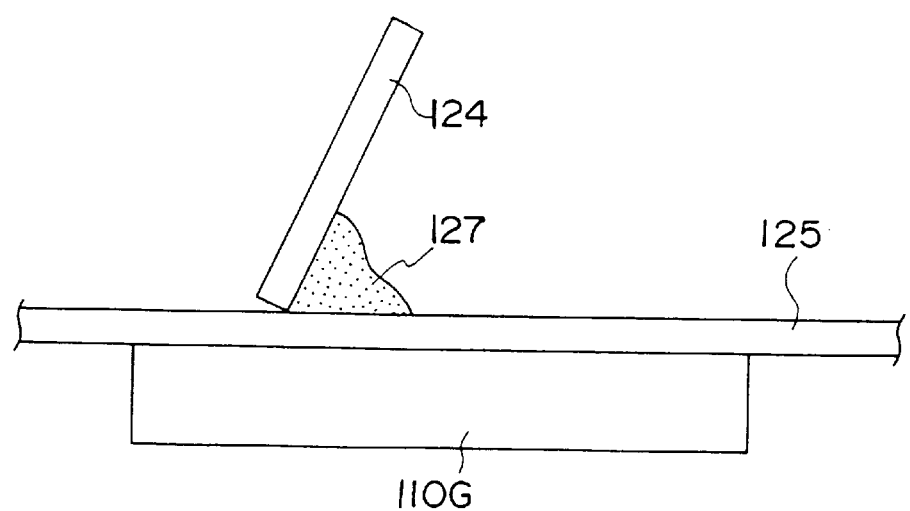
FIG. 35 is a diagram for explaining a method of arranging the solder.
Figure 36:
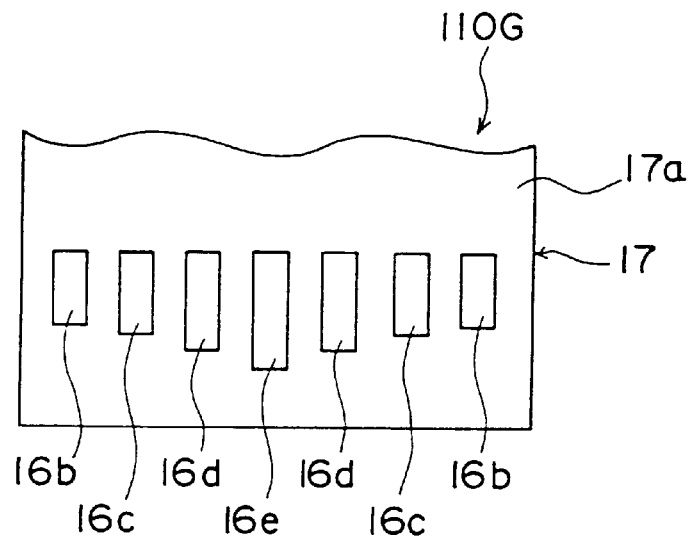
FIG. 36 is a bottom view for explaining an eighteenth embodiment of the semiconductor device according to the present invention and a ninth embodiment of the semiconductor device mounting structure according to the present invention.
Figure 37:
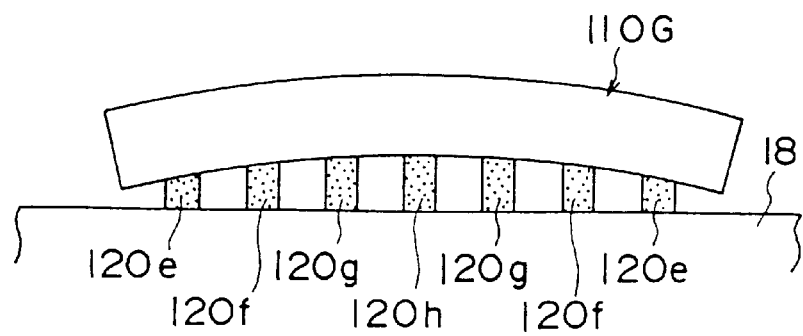
FIG. 37 is a side view for explaining the eighteenth embodiment of the semiconductor device and the ninth embodiment of the semiconductor device mounting structure.

FIGS. 34 through 37 are diagrams for explaining an eighteenth embodiment of the semiconductor device according to the present invention and a ninth embodiment of the semiconductor device mounting structure according to the present invention. For comparison purposes, FIG. 34 shows the semiconductor device mounting structure for a case where the semiconductor device 110 is warped. In FIG. 34, those parts which are the same as those corresponding parts in FIG. 22 are designated by the same reference numerals. FIG. 35 is a diagram for explaining a method of arranging the solder 120. FIG. 36 is a bottom view showing external terminals 16a through 16e for explaining the eighteenth embodiment of the semiconductor device and the ninth embodiment of the semiconductor device mounting structure. FIG. 37 is a side view showing a semiconductor device 10G in a state mounted on the circuit substrate 18 for explaining the eighteenth embodiment of the semiconductor device and the ninth embodiment of the semiconductor device mounting structure.

In each of the tenth through seventeenth embodiments of the semiconductor device described above, the amount of solder 120 that is arranged to bond and connect the semiconductor devices 110 and 110A through 110F to the circuit substrates 18 and 18A is the same at each of the plurality of external terminals 16.

On the other hand, in this eighteenth embodiment of the semiconductor device, an amount of solder 120 that is arranged at a location where the amount of warp generated in a semiconductor device 110G is large is set large compared to an amount of solder 120 that is arranged at a location where the amount of warp generated in the semiconductor device 110G is small. By employing this semiconductor device mounting structure, it is possible to positively mount the semiconductor device 110G on the circuit substrate 18 even when the warp is generated in the semiconductor device 110G, as described hereunder.

The relationship of the semiconductor device 110 and the circuit substrate 18 will now be examined for the case where a warp is generated in the semiconductor device 110.

For the sake of convenience, it will be assumed that the warp is generated in the semiconductor device 110 such that the semiconductor device 110 curves down as shown in FIG. 34. When the semiconductor device 110 curves down as shown in FIG. 34, a separating distance between the semiconductor device 110 and the circuit substrate 18 is largest at the central portion of the semiconductor device 110 and decreases towards both ends of the semiconductor device 110. On the other hand, if the semiconductor device 110 curves up, the separating distance between the semiconductor device 110 and the circuit substrate 18 is largest at both ends of the semiconductor device 110 and decreases towards the central portion of the semiconductor device 110.

When mounting the tenth through seventeenth embodiments of the semiconductor device on the circuit substrate 18 or 18A, the amount of solder 120 arranged on each of the external terminals 16 of the semiconductor device 110 is the same for each external terminal 16. Hence, in the case of the semiconductor device 110 shown in FIG. 34, solder portions 120c and 120d located at the central portion of the semiconductor device 110 where the separating distance between the semiconductor device 110 and the circuit substrate 18 is large have a vertically stretched shape and a small cross section. On the other hand, solder portions 120a and 120b located at the end portions of the semiconductor device 110 where the separating distance between the semiconductor device 110 and the circuit substrate 18 is small have a vertically squeezed shape and a large cross section.

Accordingly, there is a possibility of a poor electrical connection and a poor bonding being generated at the portion where the separating distance between the semiconductor device 110 and the circuit substrate 18 is large. In FIG. 34, the cross sectional areas of the solder portions 120c and 120d become small at the central portion where the semiconductor device 110 is warped, and there is a possibility of the poor electrical connection and the poor bonding occurring at these solder portions 120c and 120d.

On the other hand, according to this embodiment, an amount of solder 120 arranged at a portion of the semiconductor device 110G where the warp is large is set large compared to an amount of solder 120 arranged at a portion of the semiconductor device 110G where the warp is small.

The amount of solder 120 arranged with respect to each external terminal 16 of the semiconductor device 110G or, arranged with respect to each connecting electrode of the circuit substrate 18, may be varied depending on the amount of warp by employing the following method, although the varying of the amount of solder 120 is not limited to such a method.

FIG. 35 is a diagram for explaining the method of arranging the solder 120 with respect to the external terminal 16 (not visible in FIG. 35) of the semiconductor device 110G. A thick film printing method is used to arrange the solder 120 with respect to the external terminal 16 of the semiconductor device 110G. More particularly, a mask 125 having openings at positions corresponding to the positions where the external terminals 16 of the semiconductor device 110G are formed is used. A stage 124 is moved on the mask 125, so that solder paste 127 is printed on top of the external terminals 16 via the openings of the mask 125.

In addition, as shown in FIG. 36, external terminals 16d and 16e which are arranged at the portion of the semiconductor device 110G where the warp is large have shapes which are large compared to external terminals 16b and 16c which are arranged at the portion of the semiconductor device 110G where the warp is small. The areas of the openings formed in the mask 125 differ depending on the size of the external terminals 16b through 16e of the semiconductor device 110G.

When the thick film printing shown in FIG. 35 is carried out with respect to the external terminals 16b through 16e shown in FIG. 36, the amount of solder 120g and 120h arranged at the external terminals 16d and 16e where the warp of the semiconductor device 110G is large, can be set large compared to the amount of solder 120e and 120f arranged at the external terminals 16b and 16c where the warp of the semiconductor device 110G is small, as shown in FIG. 37.

As a result, even if the semiconductor device 110G warps as shown in FIG. 37, the cross sectional areas of the solders 120e through 120h can be made approximately constant regardless of the location of the solders 120e through 120h, that is, regardless of whether the solder is provided at the central portion or the end portions of the semiconductor device 110G. For this reason, it is possible to suppress generation of poor electrical connection and poor bonding, thereby making it possible to positively mount the semiconductor device 110G on the circuit substrate 18.

Of course, the arrangement of the external terminals 16b through 16e can be applied similarly to any of the semiconductor devices 110 and 110A through 110L described above.

In the tenth through eighteenth embodiments of the semiconductor device, the external terminals 16 are arranged linearly along both side at the bottom of the semiconductor devices 110 and 110A through 110G. However, as the integration density of the semiconductor device is increased, there is a tendency for the number of external terminals to increase. When the number of external terminals is large, it is possible to arrange the external terminals in an approximate checker-board pattern, as in the case of a semiconductor device 110H shown in FIG. 38. In FIG. 38, external terminals 16A and external terminals 16B are arranged in an approximate checker-board pattern. The tenth through eighteenth embodiments of the semiconductor device described above may employ an arrangement of the external terminals 16 similar to that shown in FIG. 38.

Next, a description will be given of nineteenth through twenty-first embodiments of the semiconductor device according to the present invention, by referring to FIGS. 39A through 41. The nineteenth through twenty-first embodiments of the semiconductor device are designed to improve the bonding strength between the external terminal 16 and the solder 120 (omitted in FIGS. 39A through 41).

FIGS. 39A and 39B respectively are diagrams for explaining the nineteenth embodiment of semiconductor device according to the present invention. FIG. 39A shows a cross section of a vicinity of the external terminal 16 of a semiconductor device 110I on an enlarged scale, and FIG.

39B shows a bottom view of an exposed bottom surface 16a of the semiconductor device 110I. In FIGS. 39A and 39B, those parts which are the same as those corresponding parts in FIG. 22 are designated by the same reference numerals, and description thereof will be omitted.

In this embodiment, a bottom surface 16a of the external terminal 16 of at least some of the leads 14 has small dimples 16-1 formed thereon. It is possible to increase the contact area between the bottom surface 16a and the solder 120 by forming the dimples 16-1 on the bottom surface 16a which is bonded to the solder 120. As a result, it is possible to improve the bonding strength between the lead 14 and the solder 120, and the reliability of mounting the semiconductor device 110I on the circuit substrate 18 (not shown) is improved.

Next, a description will be given of a twentieth embodiment of the semiconductor device according to the present invention, by referring to FIGS. 40A and 40B. FIGS. 40A and 40B respectively are diagrams for explaining the twentieth embodiment of semiconductor device according to the present invention. FIG. 40A shows a cross section of a vicinity of the external terminal 16 of a semiconductor device 110J on an enlarged scale, and FIG. 40B shows a bottom view of an exposed bottom surface 16a of the semiconductor device 110J. In FIGS. 40A and 40B, those parts which are the same as those corresponding parts in FIG. 22 are designated by the same reference numerals, and description thereof will be omitted.

In this embodiment, a bottom surface 16a of the external terminal 16 of at least some of the leads 14 has grooves 16-2 formed thereon. The grooves 16-2 have a triangular cross section. It is possible to increase the contact area between the bottom surface 16a and the solder 120 by forming the grooves 16-2 on the bottom surface 16a which is bonded to the solder 120. As a result, it is possible to improve the bonding strength between the lead 14 and the solder 120, and the reliability of mounting the semiconductor device 110J on the circuit substrate 18 (not shown) is improved. In other words, this embodiment can obtain basically the same effects as those of the nineteenth embodiment.

Of course, the shapes of the dimples and grooves formed on the bottom surface 16a are not limited to those shown in FIGS. 39A through 40B. The dimples or grooves formed on the bottom surface 16a may have any shape as long as the contact area between the bottom surface 16a and the solder 120 is increased compared to the case where no dimples or grooves are formed on the bottom surface 16a. Furthermore, it is possible to make the entire bottom surface 16a rough.

Next, a description will be given of a twenty-first embodiment of the semiconductor device according to the present invention, by referring to FIG. 41. FIG. 41 shows a cross section in a vicinity of the external terminal 16 of a semiconductor device 110K. In FIG. 41, those parts which are the same as those corresponding parts in FIG. 22 are designated by the same reference numerals, and description thereof will be omitted.

In this embodiment, both a top surface 16f and a bottom surface 16a of the external terminal 16 of at least some of the leads 14 have grooves 16-2 formed thereon. The grooves 16-2 have a triangular cross section. It is possible to increase the contact area between the bottom surface 16a and the solder 120 by forming the grooves 16-2 on the bottom surface 16a which is bonded to the solder 120. As a result, it is possible to improve the bonding strength between the lead 14 and the solder 120, and the reliability of mounting the semiconductor device 110K on the circuit substrate 18 (not shown) is improved. In other words, this embodiment can obtain basically the same effects as those of the nineteenth embodiment. Furthermore, it is possible to increase the contact area between the top surface 16f and the package 17 by forming the grooves 16-2 on the top surface 16f. For this reason, it is possible to improve the bonding strength between the lead 14 and the package 17.

The tenth through eighteenth embodiments of the semiconductor device described above may employ a grooved structure of the external terminals 16 similar to any of the nineteenth through twenty-first embodiments of the semiconductor device.

Next, a description will be given of twenty-second through twenty-fourth embodiments of the semiconductor device according to the present invention, by referring to FIGS. 42A through 44C.

Figure 42A:
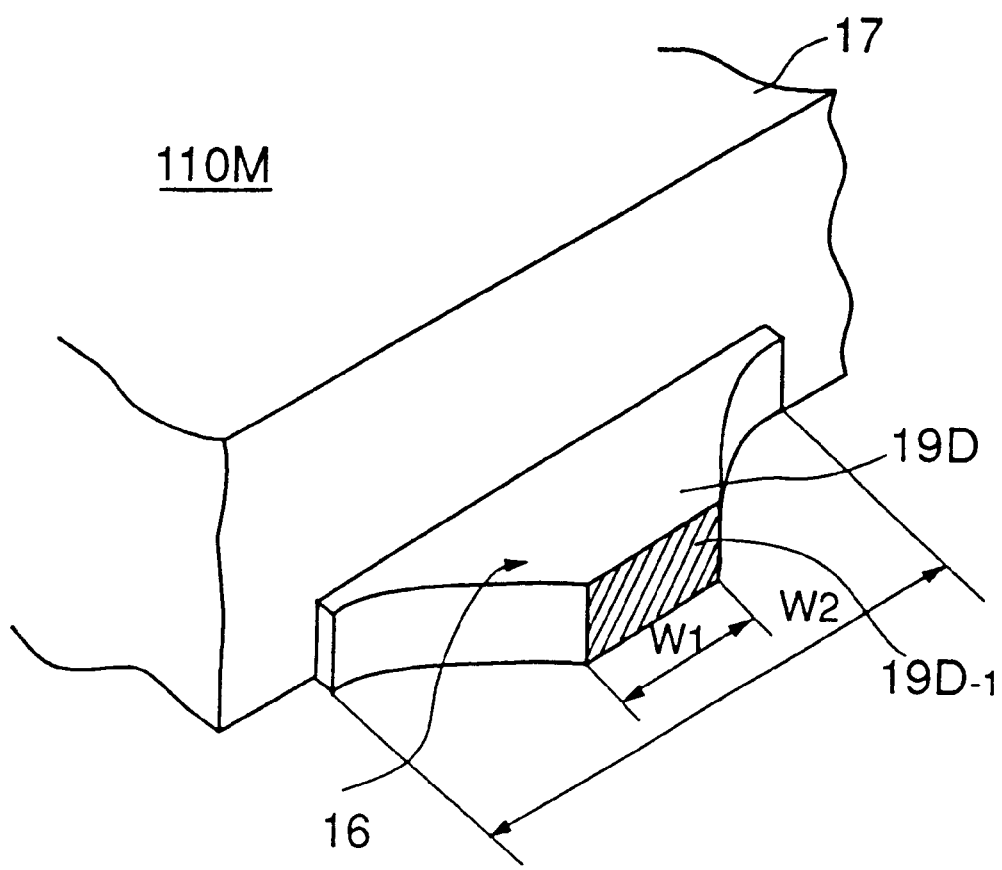
FIGS. 42A and 42B respectively are a perspective view and a plan view for explaining a twenty-second embodiment of the semiconductor device according to the present invention.
Figure 42B:
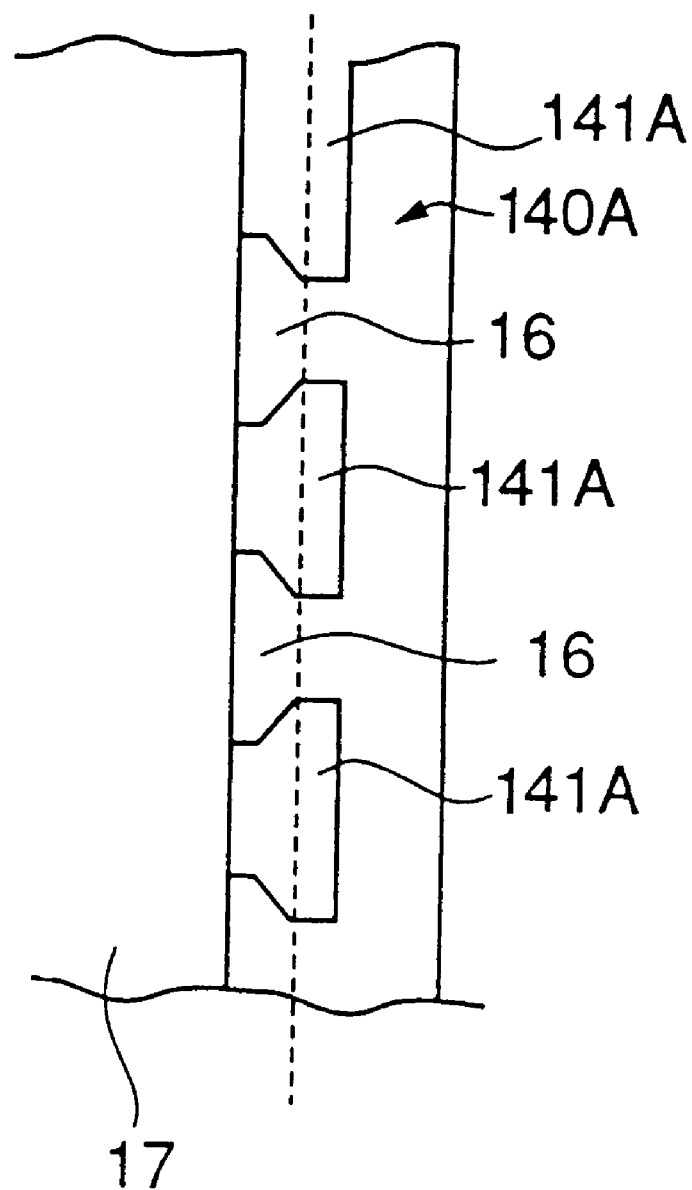

FIGS. 42A and 42B respectively are a perspective view and a plan view for explaining the twenty-second embodiment of the semiconductor device according to the present invention. FIG. 42A is a perspective view, on an enlarged scale, showing a vicinity of a lead projection 19D of a semiconductor device 110M. FIG. 42B is a plan view for explaining a method of forming the lead projection 19D. In FIGS. 42A and 42B, those parts which are the same as those corresponding parts in FIG. 22 are designated by the same reference numerals, and a description thereof will be omitted.

The semiconductor device 110M is provided with the lead projection 19D which is arranged on the external terminal 16 of the lead 14 so as to project from a wall surface of the package 17. In addition, a width W1 at the tip end portion of the lead projection 19D is made smaller than a width W2 of the lead projection 19D at the wall surface of the package 17 in FIG. 42A.

By making the width W1 at the tip end portion of the lead projection 19D narrower than the width W2 of the lead projection 19D at the wall surface of the package 17, it becomes possible to reduce the area of a cut surface 19D-1 indicated by hatching when forming the lead 14.

As described above, the plating process is carried out with respect to the external terminal 16 before the forming the lead 14. For this reason, when the lead 14 is cut by the press-working, the cut surface 19D-1 having no plated layer formed thereon becomes exposed. But according to this embodiment, the area of the cut surface 19D-1 can be made small, thereby increasing the area of the lead projection 19D that is plated when compared to the conventional case.

Therefore, a satisfactory wetting characteristic is obtained between the solder 120 and the lead projection 19D, and the mounting characteristic and the reliability of the semiconductor device 110M are improved. It is desirable that a ratio W1/W2 between the width W2 of the lead projection 19D at the wall surface of the package 17 and the width W1 of the cut surface 19D-1 at the tip end portion of the lead projection 19D is set in a range of approximately ½ to ⅓, and the wetting characteristic of the solder 120 is optimized within this range.

When forming the lead projection 19D having the above described construction, a penetrating hole 141A having a trapezoidal shape shown in FIG. 42B is formed in advance in a lead frame 140A at each position where the external terminal 16 is formed. A plating process is carried out with respect to the lead frame 140A having the penetrating holes 141A, and the lead frame 140A is thereafter cut along a dotted line in FIG. 42B.

Hence, by forming the penetrating hole 141A in advance with respect to the external terminal 16, it is possible to easily and positively form the lead projection 19D having a shape which satisfies the relationship W1<W2 by cutting the lead frame 140A, that is, the external terminal 16 at the position where the penetrating hole 141A is formed.

Figure 43A:
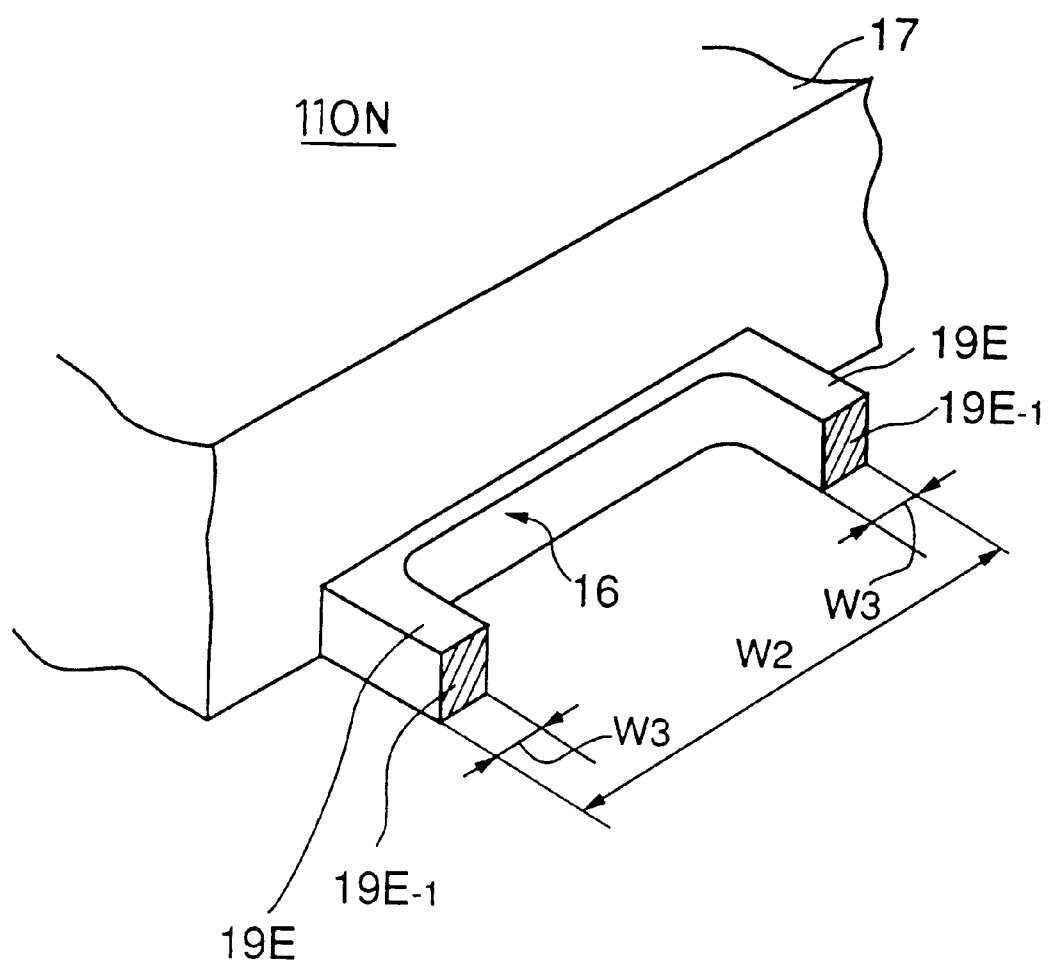
FIGS. 43A and 43B respectively are a perspective view and a plan view for explaining a twenty-third embodiment of the semiconductor device according to the present invention.
Figure 43B:
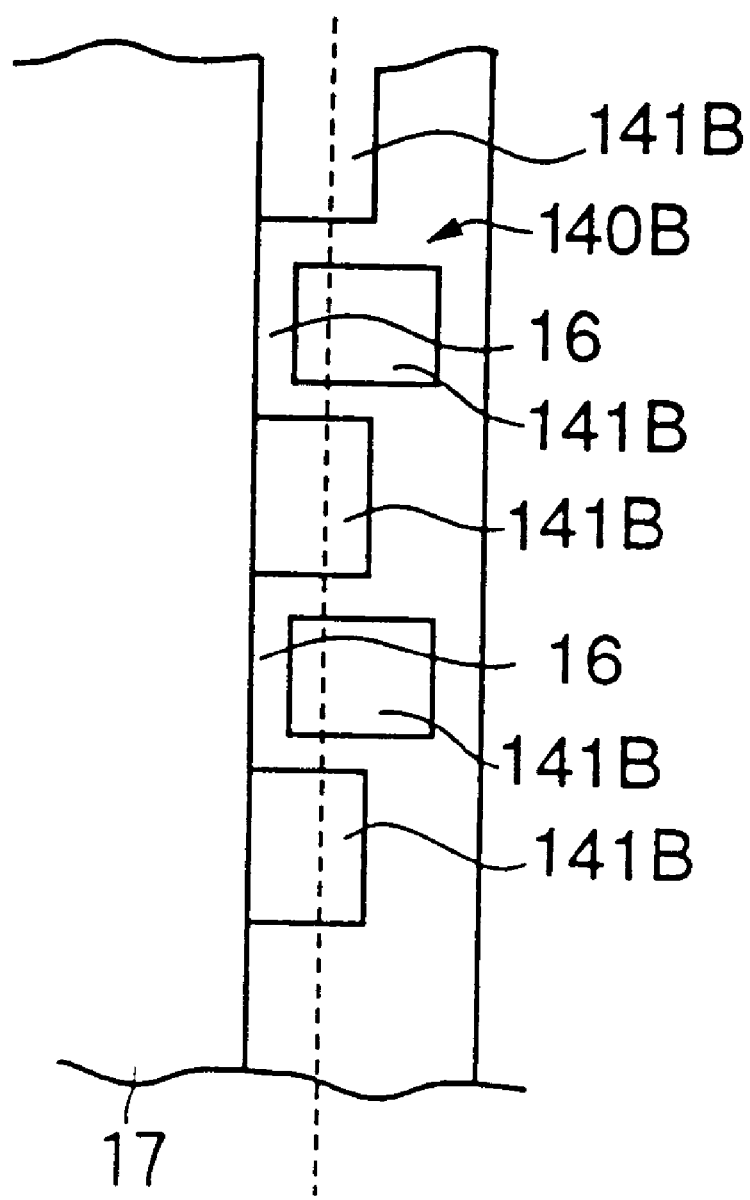

FIGS. 43A and 43B respectively are a perspective view and a plan view for explaining the twenty-third embodiment of the semiconductor device according to the present invention. FIG. 43A is a perspective view, on an enlarged scale, showing a vicinity of a lead projection 19E of a semiconductor device 110N. FIG. 43B is a plan view for explaining a method of forming the lead projection 19E. In FIGS. 43A and 43B, those parts which are the same as those corresponding parts in FIG. 22 are designated by the same reference numerals, and a description thereof will be omitted.

The semiconductor device 110N is provided with the lead projection 19E which is arranged on the external terminal 16 of the lead 14 so as to project from a wall surface of the package 17. The lead projection 19E has forked tip ends. A width W3 at each tip end portion of the lead projection 19E is made smaller than a width W2 of the lead projection 19E at the wall surface of the package 17 in FIG. 43A.

By making the width W3 at each tip end portion of the lead projection 19E narrower than the width W2 of the lead projection 19D at the wall surface of the package 17, it becomes possible to reduce the area of each cut surface 19E-1 indicated by hatching when forming the lead 14.

As described above, the plating process is carried out with respect to the external terminal 16 before the forming the lead 14. For this reason, when the lead 14 is cut by the press-working, the cut surface 19E-1 having no plated layer formed thereon becomes exposed. But according to this embodiment, the area of the cut surface 19E-1 can be made small, thereby increasing the area of the lead projection 19E that is plated when compared to the conventional case.

Therefore, a satisfactory wetting characteristic is obtained between the solder 120 and the lead projection 19E, and the mounting characteristic and the reliability of the semiconductor device 110N are improved. It is desirable that a ratio (2·W3)/W2 between the width W2 of the lead projection 19E at the wall surface of the package 17 and a sum of the widths W3 of the cut surfaces 19E-1 at the tip end portions of the lead projection 19E is set in a range of approximately ½ to ⅓, and the wetting characteristic of the solder 120 is optimized within this range.

When forming the lead projection 19E having the above described construction, a penetrating hole 141B having a rectangular shape shown in FIG. 43B is formed in advance in a lead frame 140B at each position where the external terminal 16 is formed. A plating process is carried out with respect to the lead frame 140B having the penetrating holes 141B, and the lead frame 140B is thereafter cut along a dotted line in FIG. 43B.

Hence, by forming the penetrating hole 141B in advance with respect to the external terminal 16, it is possible to easily and positively form the lead projection 19E having a shape which satisfies the relationship W3<W2 by cutting the lead frame 140B, that is, the external terminal 16 at the position where the penetrating hole 141B is formed.

Figure 44A:
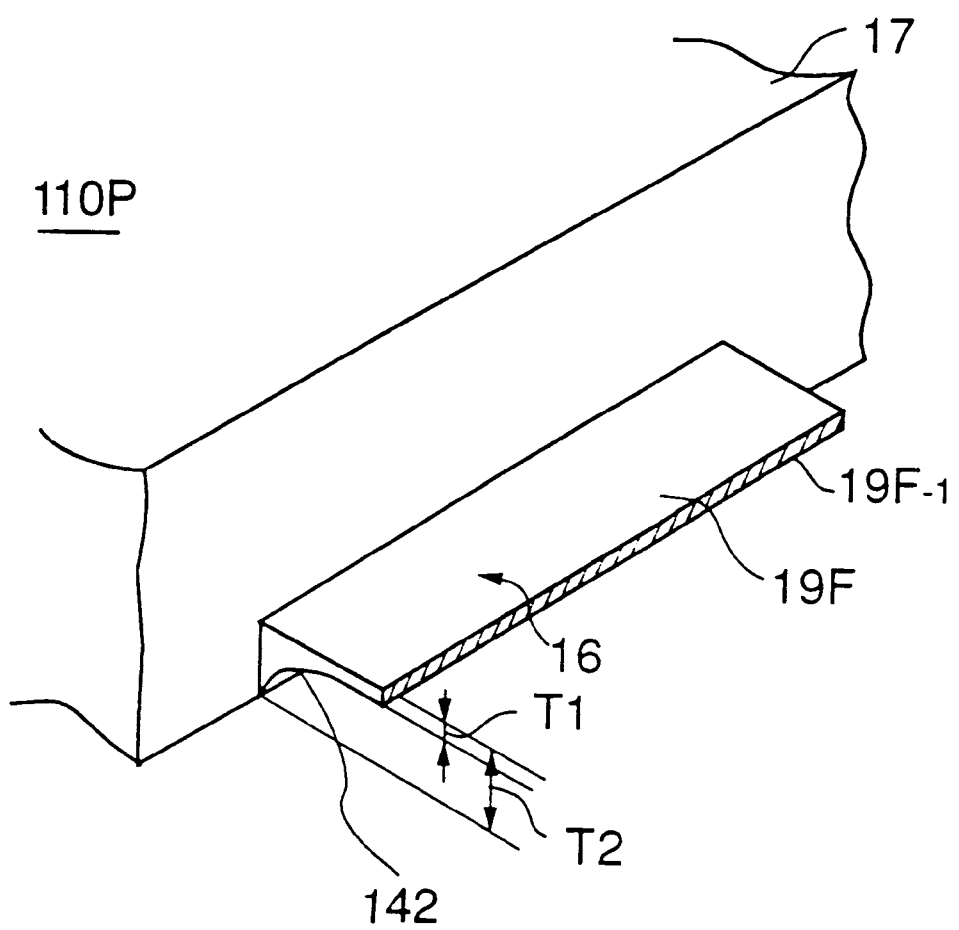
FIGS. 44A and 44B respectively are a perspective view and a plan view for explaining a twenty-fourth embodiment of the semiconductor device according to the present invention.
Figure 44B:
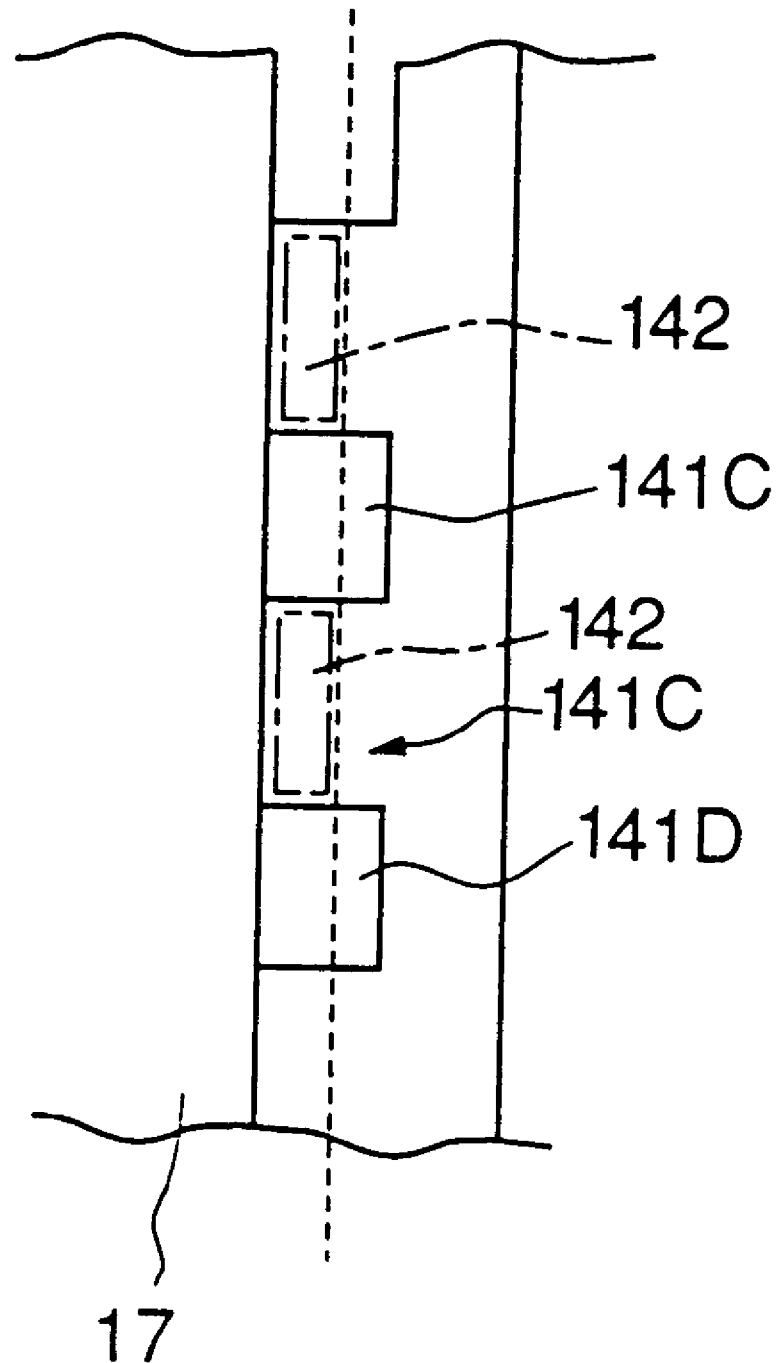

FIGS. 44A and 44B respectively are a perspective view and a plan view for explaining the twenty-fourth embodiment of the semiconductor device according to the present invention. FIG. 44A is a perspective view, on an enlarged scale, showing a vicinity of a lead projection 19F of a semiconductor device 110P. FIG. 44B is a plan view for explaining a method of forming the lead projection 19F. In FIGS. 44A and 44B, those parts which are the same as those corresponding parts in FIG. 22 are designated by the same reference numerals, and a description thereof will be omitted.

The semiconductor device 110P is provided with the lead projection 19F which is arranged on the external terminal 16 of the lead 14 so as to project from a wall surface of the package 17. In addition, a thickness T1 at the tip end portion of the lead projection 19F is made smaller than a thickness T2 of the lead projection 19F at the wall surface of the package 17 in FIG. 44A.

By making the thickness T1 at the tip end portion of the lead projection 19F thinner than the thickness T2 of the lead projection 19F at the wall surface of the package 17, it becomes possible to reduce the area of a cut surface 19F-1 indicated by hatching when forming the lead 14.

As described above, the plating process is carried out with respect to the external terminal 16 before the forming the lead 14. For this reason, when the lead 14 is cut by the press-working, the cut surface 19F-1 having no plated layer formed thereon becomes exposed. But according to this embodiment, the area of the cut surface 19F-1 can be made small, thereby increasing the area of the lead projection 19F that is plated when compared to the conventional case.

Therefore, a satisfactory wetting characteristic is obtained between the solder 120 and the lead projection 19F, and the mounting characteristic and the reliability of the semiconductor device 110P are improved.

When forming the lead projection 19F having the above described construction, a tapered portion 142 having a shape such that the thickness thereof decreases from the package side towards the outer side as shown in FIG. 44A and a penetrating hole 141C shown in FIG. 44B are formed in advance in a lead frame 140C, by an etching or press-working, at each position where the external terminal 16 is formed. A plating process is carried out with respect to the lead frame 140C having the tapered portion 142 and the penetrating holes 141C, and the lead frame 140C is thereafter cut along a dotted line in FIG. 44B.

Hence, by forming the tapered portion 142 and the penetrating hole 141C in advance with respect to the external terminal 16, it is possible to easily and positively form the lead projection 19F having a shape which satisfies the relationship T1<T2 by cutting the lead frame 140C, that is, the external terminal 16 at the position where the tapered portion 142 is formed.

The location of the tapered portion 142 is not limited to that shown in FIG. 44A, that is, at the bottom of the external terminal 16. For example, the tapered portion 142 may be located at the top of the external terminal 16.

Figure 45:
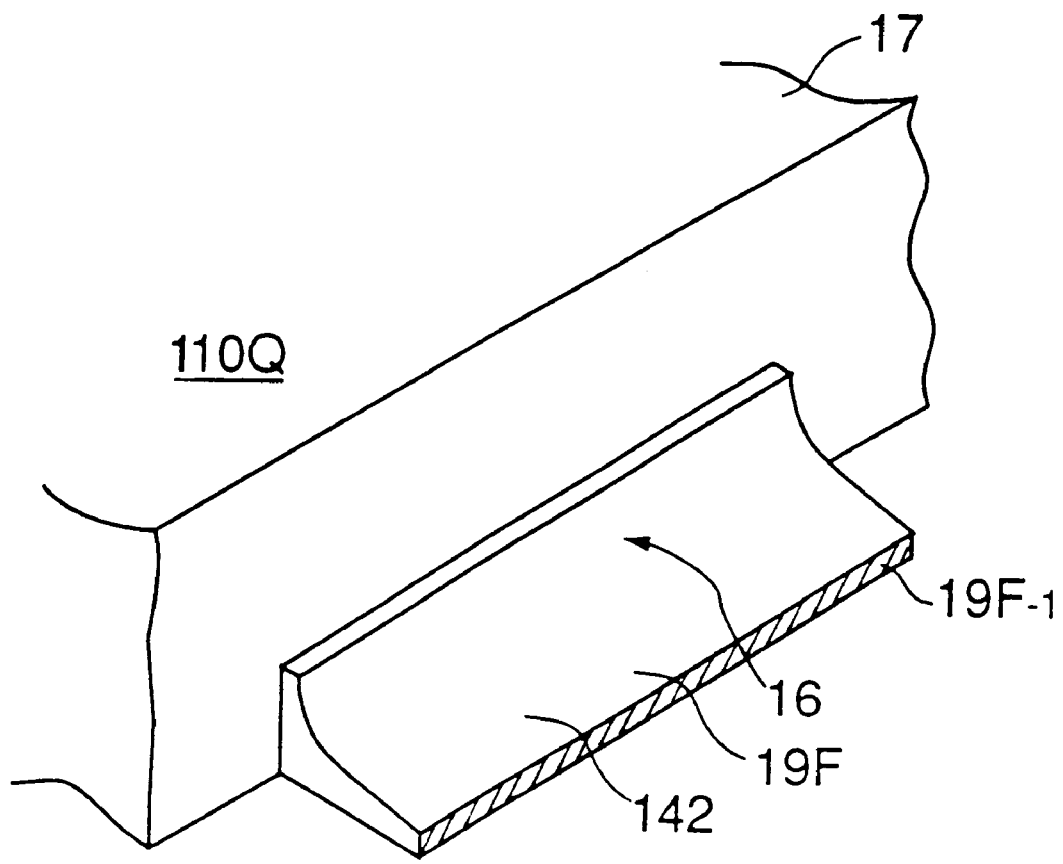
FIG. 45 is a perspective view for explaining a modification of the twenty-fourth embodiment of the semiconductor device.

FIG. 45 is a perspective view for explaining a modification of the twenty-fourth embodiment of the semiconductor device according to the present invention. FIG. 45 is a perspective view, on an enlarged scale, showing a vicinity of a lead projection 19F of a semiconductor device 110W. In FIG. 45, those parts which are the same as those corresponding parts in FIGS. 44A and 44B are designated by the same reference numerals, and a description thereof will be omitted.

As shown in FIG. 45, the tapered portion 142 of the lead projection 19F of the semiconductor device 110Q is located on the top of the external terminal 16.

Of course, the embodiments described heretofore may be appropriately combined to obtain the desired results of particular embodiments.

Further, the present invention is not limited to these embodiments, but various variations and modifications may be made without departing from the scope of the present invention.

What is claimed is:

1. A semiconductor device comprising:
   a semiconductor chip;
   a package encapsulating said semiconductor chip, said package having a wall surface;
   a plurality of leads each having one end electrically connected to said semiconductor chip and another end exposed at the wall surface of said package to form an external terminal, each of said leads excluding the external terminal being encapsulated within said package; and
   a lead projection provided on the external terminal of the lead, said lead projection projecting from the wall surface of said package, wherein a projecting amount of said lead projection from the wall surface of said package is in a range of 20 $\mu$m to 150 $\mu$m.

2. The semiconductor device as claimed in claim 1, wherein said lead projection is integrally formed on the lead as a bent portion of the external terminal.

3. The semiconductor device as claimed in claim 1, wherein said lead projection is integrally formed on the lead as a remaining portion of the external terminal which is etched.

4. The semiconductor device as claimed in claim 1, wherein said lead projection is integrally formed on the lead as a remaining portion of the external terminal which is plastic-worked.

5. A semiconductor device comprising:
   a semiconductor chip;
   a package encapsulating said semiconductor chip, said package having a wall surface;
   a plurality of leads each having one end electrically connected to said semiconductor chip and another end exposed at the wall surface of said package to form an external terminal, each of said leads excluding the external terminal being encapsulated within said package; and
   a lead projection provided on the external terminal of the lead, said lead projection projecting from the wall surface of said package, wherein a relationship $0.4 \cdot T \leq H_1 \leq 3.0 \cdot T$ stands, where $H_1$ denotes a projecting amount of said lead projection from the wall surface of said package, and T denotes a thickness of the lead.

6. A semiconductor device comprising:
   a semiconductor chip;
   a package encapsulating said semiconductor chip, said package having a wall surface;
   a plurality of leads each having one end electrically connected to said semiconductor chip and another end exposed at the wall surface of said package to form an external terminal, each of said leads excluding the external terminal being encapsulated within said package; and
   a package projection provided on the wall surface of said package where the external terminal of the lead is exposed, said package projection projecting with respect to the external terminal, wherein a projecting amount of said package projection from the external terminal is in a range of 20 $\mu$m to 150 $\mu$m.

7. A semiconductor device comprising:
   a semiconductor chip;
   a package encapsulating said semiconductor chip, said package having a wall surface;
   a plurality of leads each having one end electrically connected to said semiconductor chip and another end exposed at the wall surface of said package to form an external terminal, each of said leads excluding the external terminal being encapsulated within said package; and
   a package projection provided on the wall surface of said package where the external terminal of the lead is exposed, said package projection projecting with respect to the external terminal, wherein a relationship $0.4 \cdot T \leq H_2 \leq 3.0 \cdot T$ stands, where $H_2$ denotes a projecting amount of said package projection from the external terminal, and T denotes a thickness of the lead.

8. A semiconductor device comprising:
   a semiconductor chip;
   a package encapsulating said semiconductor chip, said package having a wall surface;
   a plurality of leads each having one end electrically connected to said semiconductor chip and another end exposed at the wall surface of said package to form an external terminal, each of said leads excluding the external terminal being encapsulated within said package; and
   a lead recess provided on the external terminal of the lead, said lead recess being caved in from the wall surface of said package, wherein a depth of said lead recess from the wall surface of said package is in a range of 20 $\mu$m to 150 $\mu$m.

9. A semiconductor device comprising:
   a semiconductor chip;
   a package encapsulating said semiconductor chip, said package having a wall surface;
   a plurality of leads each having one end electrically connected to said semiconductor chip and another end exposed at the wall surface of said package to form an external terminal, each of said leads excluding the external terminal being encapsulated within said package; and
   a lead recess provided on the external terminal of the lead, said lead recess being caved in from the wall surface of said package, wherein a relationship $0.4 \cdot T \leq H_3 \leq 3.0 \cdot T$ stands, where $H_3$ denotes a depth of said lead recess from the wall surface of said package, and T denotes a thickness of the lead.

10. A semiconductor device mounting structure for mounting a semiconductor device on a surface of a circuit substrate using a soft bonding material, said semiconductor device comprising a semiconductor chip, a package encapsulating the semiconductor chip and having a wall surface, and a plurality of leads each having one end electrically connected to the semiconductor chip and another end exposed at the wall surface of the package to form an external terminal, each of said leads excluding the external terminal being encapsulated within the package, said semiconductor device mounting structure comprising:
   a spacer supporting said semiconductor device on said circuit substrate in a state where said semiconductor device is separated from the surface of said circuit substrate, a gap being formed between said semiconductor device and said circuit substrate; and
   a soft bonding material arranged at said gap and bonding said semiconductor device and said circuit substrate.

11. The semiconductor device mounting structure as claimed in claim 10, wherein a height of said spacer from the surface of said circuit substrate is in a range of 20 μm to 150 μm.

12. The semiconductor device mounting structure as claimed in claim 10, wherein said soft bonding material is made of solder which electrically connects said semiconductor device and said circuit substrate.

13. A semiconductor device mounting structure for mounting a semiconductor device on a surface of a circuit substrate using a soft bonding material, said semiconductor device comprising a semiconductor chip, a package encapsulating the semiconductor chip and having a wall surface, and a plurality of leads each having one end electrically connected to the semiconductor chip and another end exposed at the wall surface of the package to form an external terminal, each of said leads excluding the external terminal being encapsulated within the package, said soft bonding material being arranged on the external terminal of on connection electrodes provided on said circuit substrate, said semiconductor device mounting structure comprising:

a bonding portion bonding the external terminal of the semiconductor device to the connection electrode of the circuit substrate at a first location of the semiconductor device; and a bonding portion bonding the external terminal of the semiconductor device to the connection electrode of the circuit substrate at a second location of the semiconductor device different from the first location, a distance between the semiconductor device and the circuit substrate at the first location being greater than that at the second location, an amount of soft bonding material forming said first bonding portion being greater than an amount of soft bonding material forming said second bonding portion.

14. The semiconductor device mounting structure as claimed in claim 13, wherein said soft bonding material is made of solder which electrically connects the semiconductor device and the circuit substrate.

15. A semiconductor device comprising:

a semiconductor chip;

a package encapsulating said semiconductor chip, said package having a wall surface;

a plurality of leads each having one end electrically connected to said semiconductor chip and another end exposed at the wall surface of said package to form an external terminal, each of said leads excluding the external terminal being encapsulated within said package; and a lead projection provided on the external terminal of the lead, said lead projection projecting from the wall surface of said package and having a width which is smaller at a tip end portion of said lead projection than at the wall surface of said package, wherein a projecting amount of said lead projection from the wall surface of said package is in a range of 20 μm to 150 μm.

16. A semiconductor device comprising:

a semiconductor chip;

a package encapsulating said semiconductor chip, said package having a wall surface;

a plurality of leads each having one end electrically connected to said semiconductor chip and another end exposed at the wall surface of said package to form an external terminal, each of said leads excluding the external terminal being encapsulated within said package; and a lead projection provided on the external terminal of the lead, said lead projection projecting from the wall surface of said package and having a width which is smaller at a tip end portion of said lead projection than at the wall surface of said package, wherein a relationship $0.4 \cdot T \leq H_1 \leq 3.0 \cdot T$ stands, where $H_1$ denotes a projecting amount of said lead projection from the wall surface of said package, and T denotes a thickness of the lead.

17. A semiconductor device comprising:

a semiconductor chip;

a package encapsulating said semiconductor chip, said package having a wall surface;

a plurality of leads each having one end electrically connected to said semiconductor chip and another end exposed at the wall surface of said package to form an external terminal, each of said leads excluding the external terminal being encapsulated within said package; and a lead projection provided on the external terminal of the lead, said lead projection projecting from the wall surface of said package and having a width which is smaller at a tip end portion of said lead projection than at the wall surface of said package, wherein the width of said lead projection at the tip end portion of said lead projection is approximately ½ to ⅓ the width of said lead projection at the wall surface of said package.

18. A semiconductor device comprising:

a semiconductor chip;

a package encapsulating said semiconductor chip, said package having a wall surface;

a plurality of leads each having one end electrically connected to said semiconductor chip and another end exposed at the wall surface of said package to form an external terminal, each of said leads excluding the external terminal being encapsulated within said package; and a lead projection provided on the external terminal of the lead, said lead projection projecting from the wall surface of said package and having a thickness which is smaller at a tip end portion of said lead projection than at the wall surface of said package, wherein a projecting amount of said lead projection from the wall surface of said package is in a range of 20 μm to 150 μm.

19. A semiconductor device comprising:

a semiconductor chip;

a package encapsulating said semiconductor chip, said package having a wall surface;

a plurality of leads each having one end electrically connected to said semiconductor chip and another end exposed at the wall surface of said package to form an external terminal, each of said leads excluding the external terminal being encapsulated within said package; and a lead projection provided on the external terminal of the lead, said lead projection projecting from the wall surface of said package and having a thickness which is smaller at a tip end portion of said lead projection than at the wall surface of said package, wherein a relationship $0.4 \cdot T \leq H_1 \leq 3.0 \cdot T$ stands, where $H_1$ denotes a projecting amount of said lead projection from the wall surface of said package, and T denotes a thickness of the lead.

* * * * *